(12) United States Patent
Choi et al.

(10) Patent No.: US 11,171,107 B2
(45) Date of Patent: Nov. 9, 2021

(54) SEMICONDUCTOR PACKAGE

(71) Applicant: SAMSUNG ELECTRONICS CO., LTD., Suwon-si (KR)

(72) Inventors: Gyu Jin Choi, Suwon-si (KR); Sung Hoan Kim, Suwon-si (KR); Chang Eun Joo, Suwon-si (KR); Chil Woo Kwon, Suwon-si (KR); Young Kyu Lim, Suwon-si (KR); Sung Uk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 16/713,143

(22) Filed: Dec. 13, 2019

(65) Prior Publication Data
US 2020/0335468 A1    Oct. 22, 2020

(30) Foreign Application Priority Data

Apr. 17, 2019    (KR) .......................... 10-2019-0045046

(51) Int. Cl.
*H01L 23/52* (2006.01)
*H01L 23/00* (2006.01)
(Continued)

(52) U.S. Cl.
CPC ............. *H01L 24/16* (2013.01); *H01L 23/13* (2013.01); *H01L 23/3128* (2013.01); *H01L 23/49816* (2013.01); *H01L 23/49822* (2013.01); *H01L 23/49838* (2013.01); *H01L 23/49894* (2013.01); *H01L 24/13* (2013.01); *H01L 21/4853* (2013.01); *H01L 21/4857* (2013.01); *H01L 24/96* (2013.01); *H01L 2224/13006* (2013.01); *H01L 2224/16235* (2013.01)

(58) Field of Classification Search
CPC .......... H01L 23/49894; H01L 23/3128; H01L 23/13; H01L 23/49822; H01L 23/49816; H01L 23/49838; H01L 24/13; H01L 24/16
USPC ....................................................... 257/737
See application file for complete search history.

(56) References Cited

U.S. PATENT DOCUMENTS 9,576,919 B2 * 2/2017 Scanlan .................. H01L 24/13
9,754,835 B2 * 9/2017 Scanlan .................. H01L 24/96
(Continued)

FOREIGN PATENT DOCUMENTS

KR           10-0751663 B1    8/2007
KR    10-2017-0070779 A       6/2017

*Primary Examiner* — Luan C Thai
(74) *Attorney, Agent, or Firm* — Sughrue Mion, PLLC

(57) ABSTRACT

A semiconductor package includes: a semiconductor chip including a body having a first surface and a second surface, opposing the first surface, a connection pad disposed on the first surface of the body, and an extension pad disposed on the connection pad; and a connection structure including an insulating layer disposed on the first surface of the body of the semiconductor chip, a redistribution via penetrating through the insulating layer and having one side thereof in contact with the extension pad, and a redistribution layer disposed on the insulating layer and having a via pad in contact with the other side of the redistribution via, wherein a horizontal cross-sectional area of extension pad of the semiconductor chip is greater than a horizontal cross-sectional area of the connection pad of the semiconductor chip.

19 Claims, 22 Drawing Sheets

(51) Int. Cl.
*H01L 23/498* (2006.01)
*H01L 23/13* (2006.01)
*H01L 23/31* (2006.01)
*H01L 21/48* (2006.01)

(56) References Cited

U.S. PATENT DOCUMENTS

| | | | |
|---|---|---|---|
| 9,899,331 B2* | 2/2018 | Lee | H01L 23/49822 |
| 10,068,853 B2* | 9/2018 | Hu | H01L 21/565 |
| 10,128,182 B2* | 11/2018 | Cheng | H01L 24/08 |
| 10,283,473 B1* | 5/2019 | Yu | H01L 25/0655 |
| 2008/0057694 A1 | 3/2008 | Kim et al. | |
| 2016/0013148 A1* | 1/2016 | Lin | H01L 23/5389 257/773 |
| 2016/0338202 A1* | 11/2016 | Park | H01L 24/00 |
| 2017/0170127 A1 | 6/2017 | Choi et al. | |

* cited by examiner

III-III'

SEMICONDUCTOR PACKAGE

CROSS-REFERENCE TO RELATED APPLICATION

This application claims priority from Korean Patent Application No. 10-2019-0045046, filed on Apr. 17, 2019, in the Korean Intellectual Property Office, the disclosure of which is incorporated herein by reference.

BACKGROUND

1. Field

Apparatuses and consistent with example embodiments of the inventive concept relate to a semiconductor package, and more particularly to a fan-out semiconductor package capable of extending a connection terminal outwardly of a region in which a semiconductor device is disposed.

2. Description of Related Art

Recently, a main trend in the development of technology related to semiconductor chips is to reduce the size of components. Therefore, in the package field, it is necessary to implement a large number of pins on a semiconductor chip having a compact size in accordance with a rapid increase in demand for small-sized semiconductor chips, and the like.

One type of semiconductor package technology suggested to satisfy the technical demand is a fan-out semiconductor package. Such a fan-out package has a compact size and may allow a plurality of pins to be implemented on a semiconductor chip by redistributing electrical connection structures outwardly from a region in which the semiconductor chip is disposed.

SUMMARY

Example embodiments of the present inventive concept provide a semiconductor package capable of improving efficiency of a redistribution process of a connection pad of a semiconductor device and reducing a lead time and production costs.

The example embodiments of the present inventive concept may enable to secure a matching margin between a connection pad of a semiconductor device and a redistribution layer, thereby improving efficiency of the redistribution process.

According to the example embodiments, a semiconductor package may include: a semiconductor chip including a body having a first surface and a second surface, opposing the first surface, a connection pad disposed on the first surface of the body, and an extension pad disposed on the connection pad; an encapsulant encapsulating at least a portion of the semiconductor chip; and a connection structure including an insulating layer disposed on the first surface of the semiconductor chip, a redistribution via penetrating through the insulating layer and having one side thereof in contact with the extension pad, and a redistribution layer disposed on the insulating layer and having a via pad in contact with the other side of the redistribution via, wherein a horizontal cross-sectional area of the extension pad of the semiconductor chip is greater than a horizontal cross-sectional area of the via pad of the redistribution layer, and the horizontal cross-sectional area of the extension pad of the semiconductor chip is greater than a horizontal cross-sectional area of the connection pad of the semiconductor chip.

According to the example embodiments, a semiconductor package may include: a semiconductor chip including a body having a first surface and a second surface, opposing the first surface, a connection pad disposed on the first surface of the body, and an extension pad disposed on the connection pad; an encapsulant encapsulating at least a portion of the semiconductor chip; and a connection structure disposed on the first surface of the body of the semiconductor chip and including a redistribution layer electrically connected to the extension pad, wherein the semiconductor chip is located in a horizontal cross-sectional region of the connection structure, wherein a first reference line parallel to a first edge of one side of the semiconductor chip and a second reference line parallel to a second edge of another side of the semiconductor chip, orthogonal to each other at a center of the semiconductor chip, has predetermined displacements, respectively, with respect to a third reference line parallel to a third edge of one side of the connection structure and a fourth reference line parallel to a fourth edge of another side of the connection structure.

BRIEF DESCRIPTION OF DRAWINGS

The above and other aspects, features, and advantages of the example embodiments will be more clearly understood from the following detailed description taken in conjunction with the accompanying drawings, in which.

DETAILED DESCRIPTION

Figure 1:
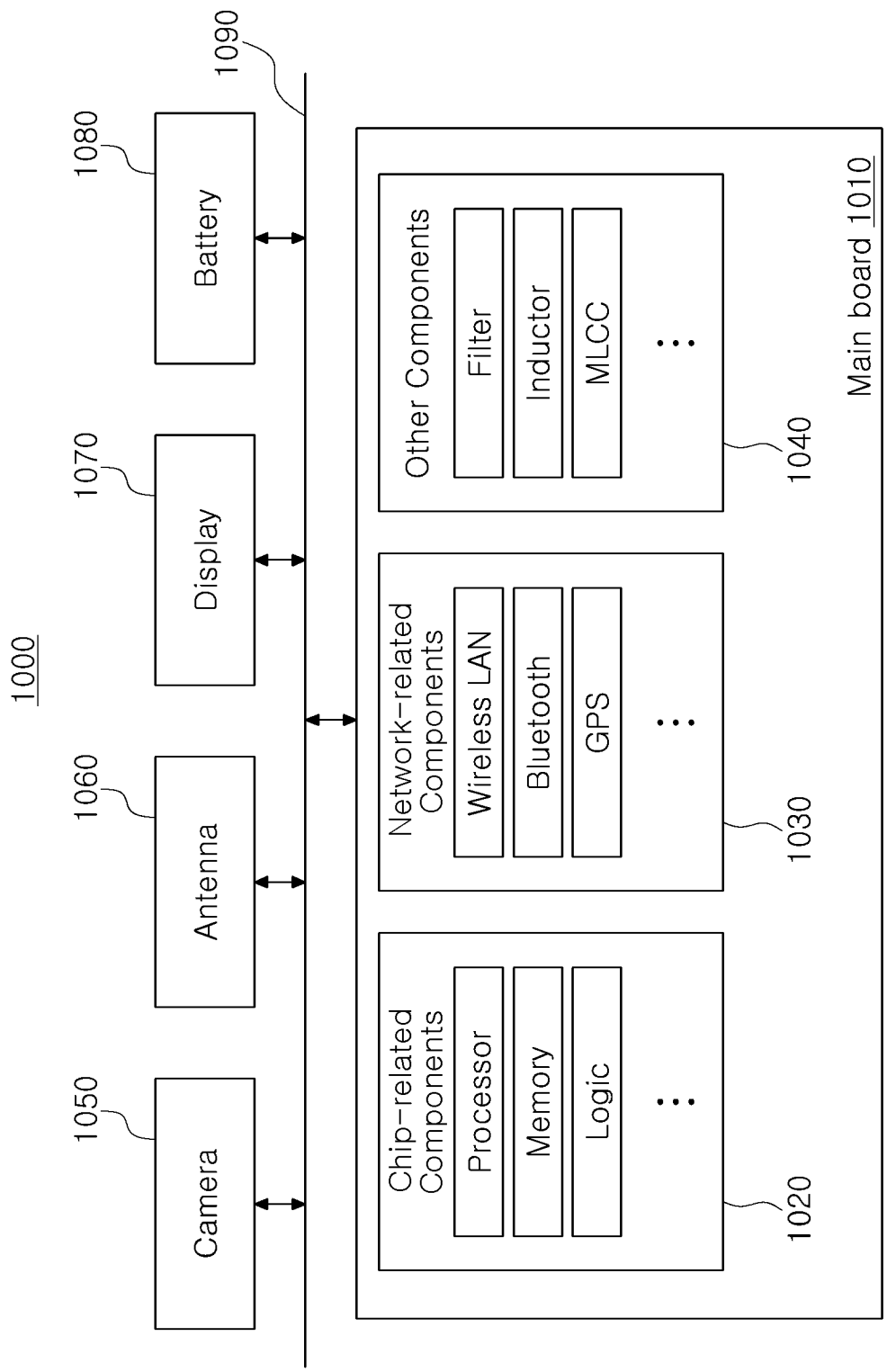
FIG. 1 is a schematic block diagram illustrating an example of an electronic device system.

Hereinafter, the inventive concept will be described with reference to the accompanying drawings. The shapes and sizes of elements in the drawings may be exaggerated or reduced for clarity.

Electronic Device

FIG. 1 is a schematic block diagram illustrating an example of an electronic device system.

Referring to FIG. 1, an electronic device 1000 may receive a mainboard 1010. The mainboard 1010 may include chip related components 1020, network related components 1030, other components 1040, or the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, and may include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but may also include passive components used for various other purposes, or the like. In addition, the other components 1040 may be combined with one another, together with the chip related components 1020 and/or the network related components 1030 described above.

Depending on a type of the electronic device 1000, the electronic device 1000 includes additional components that may or may not be physically or electrically connected to the mainboard 1010. These additional components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these additional components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
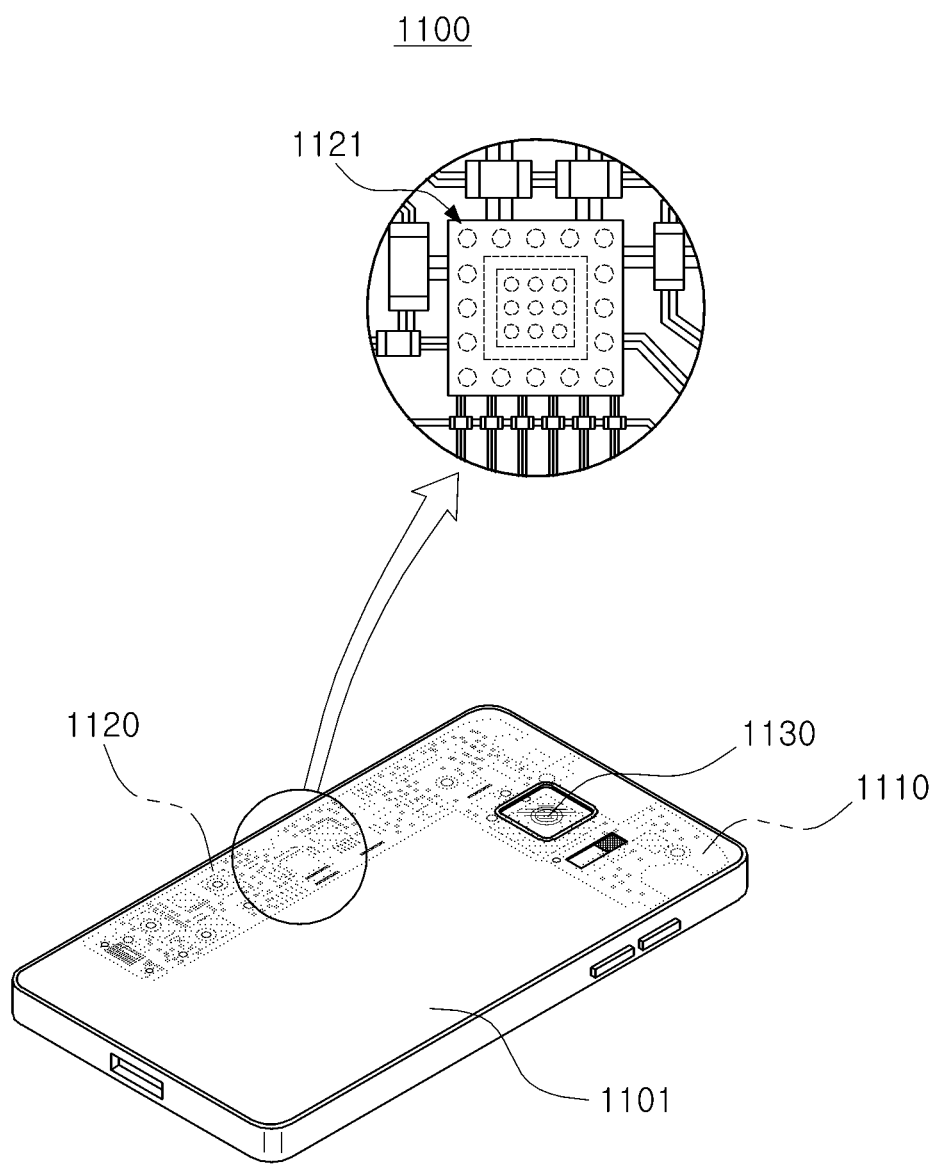
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
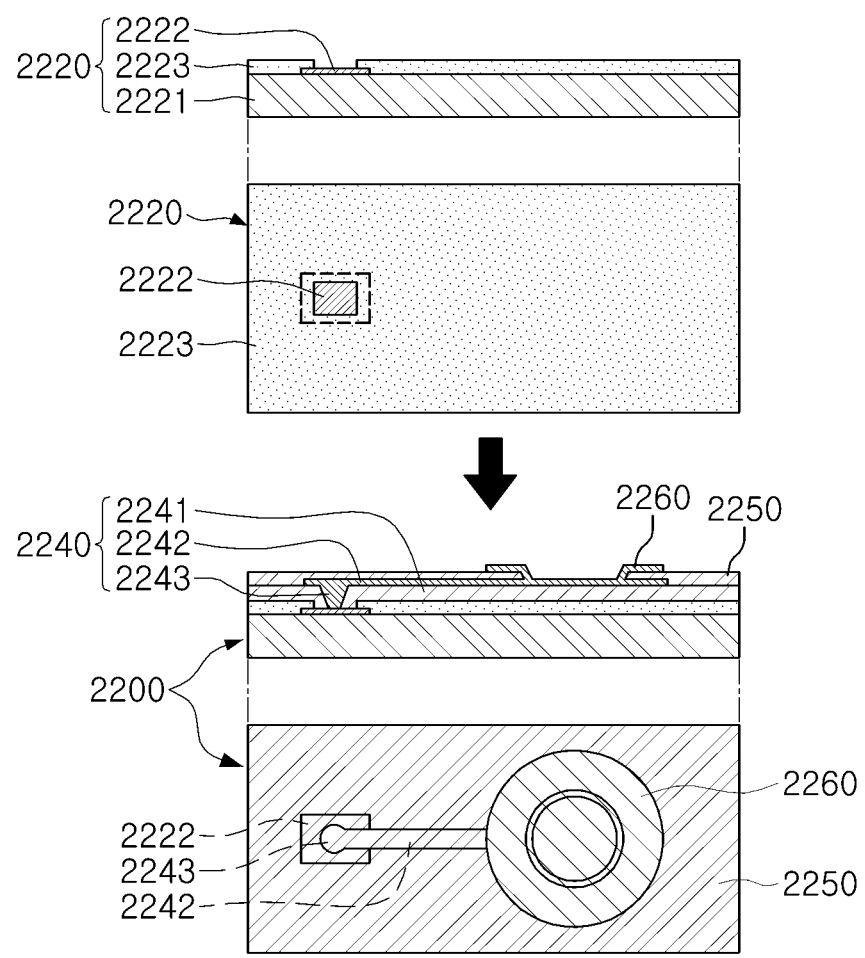
FIGS. 3A and 3B are schematic cross-sectional views illustrating states of a fan-in semiconductor package before and after being packaged.
Figure 3B:
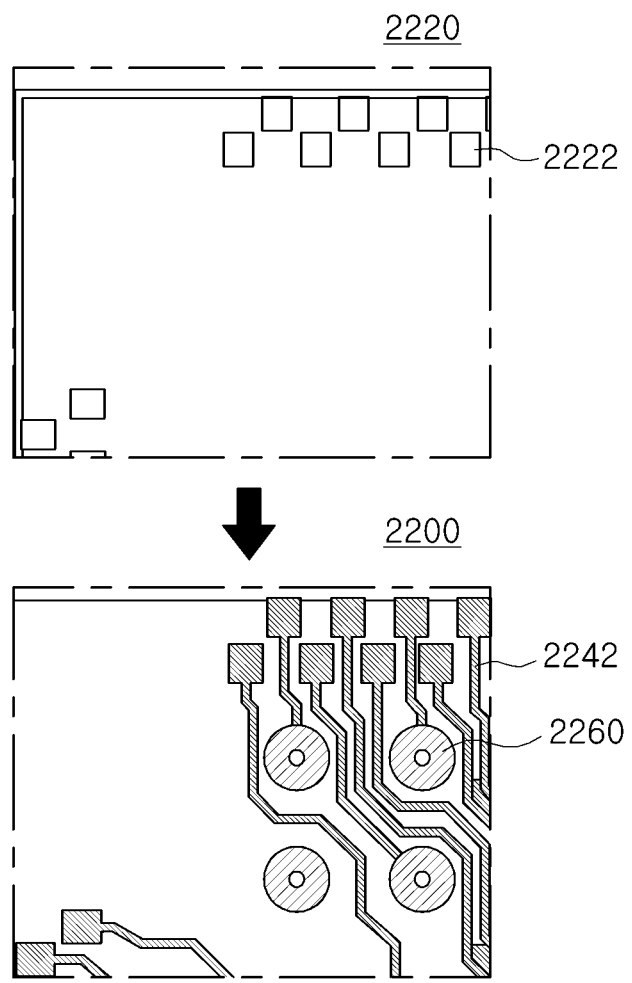

FIGS. 3A and 3B are schematic cross-sectional views illustrating states of a fan-in semiconductor package before and after being packaged.

Figure 4:
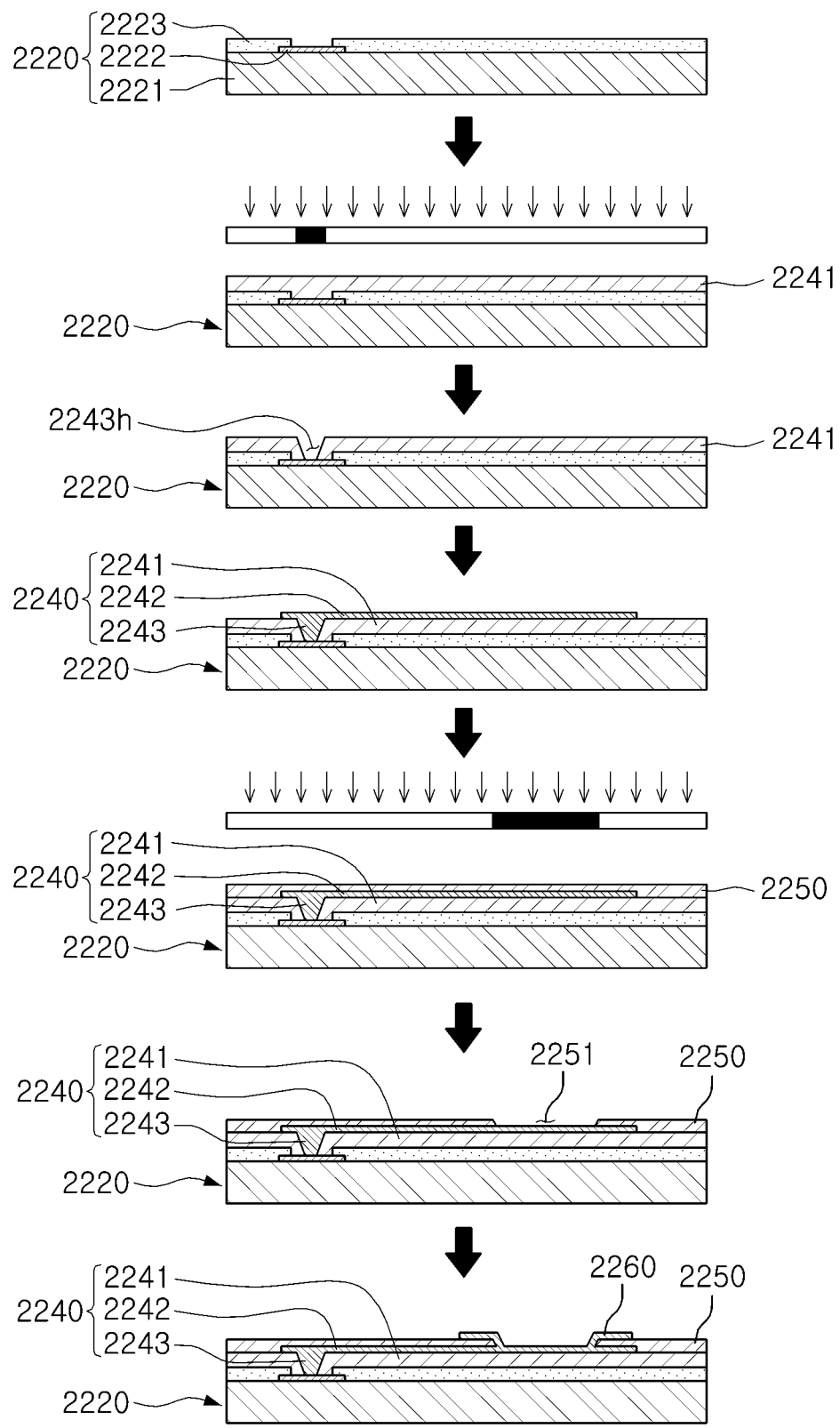
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed on the semiconductor chip 2220 depending on a size of the semiconductor chip 2220 in order to redistribute the connection pads 2222. The connection structure 2240 may include an insulating layer 2241 formed on the semiconductor chip 2220 using an insulating material such as a photoimagable dielectric (PID) resin, via holes 2243h penetrating the insulation layer 241 to open the connection pads 2222, and then wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
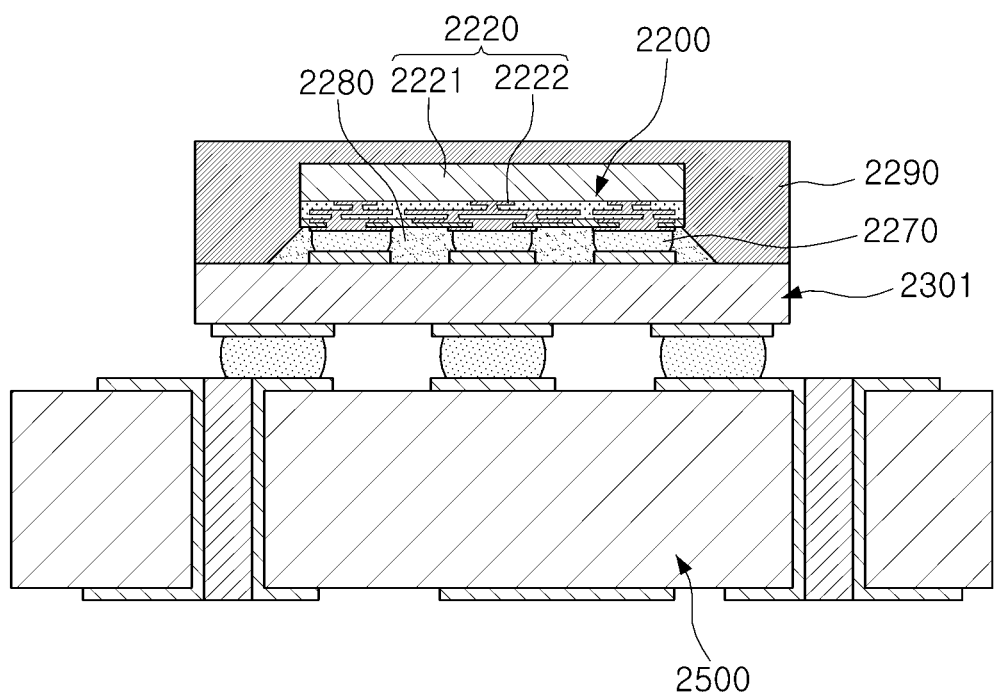
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
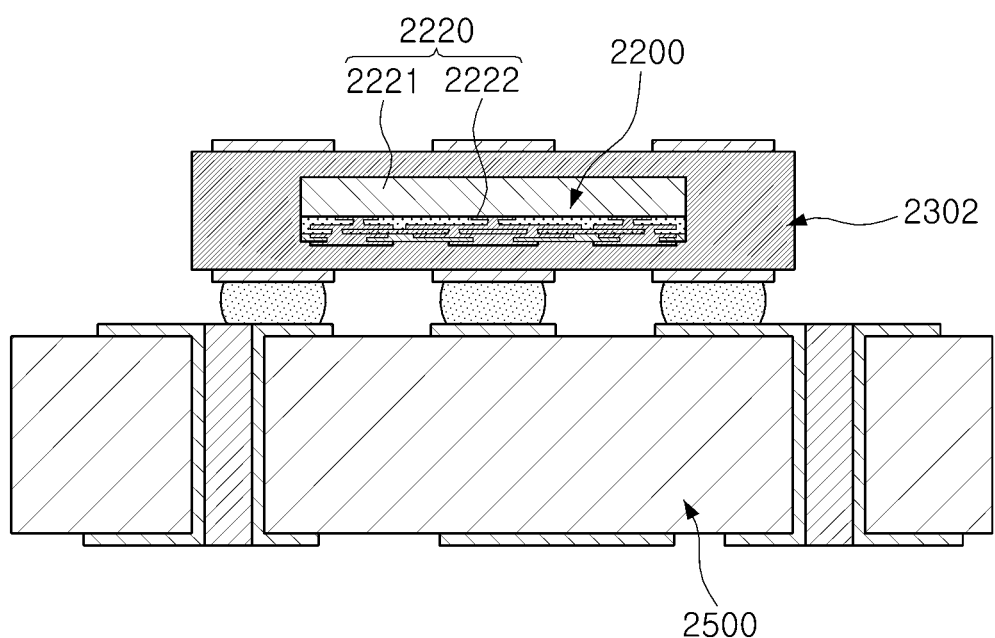
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
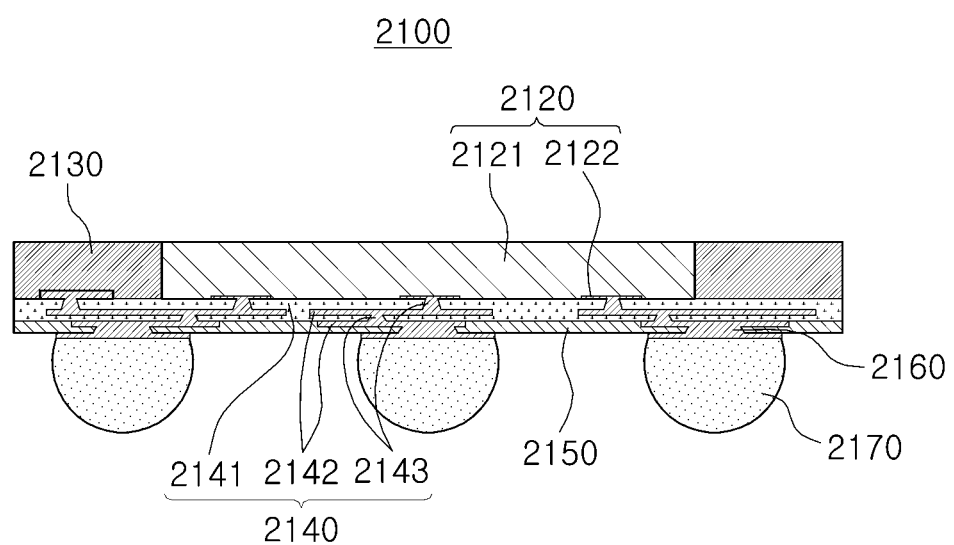
FIG. 7 is a schematic cross-sectional view illustrating a fan-out semiconductor package according to an example embodiment.

FIG. 7 is a schematic cross-sectional view illustrating a fan-out semiconductor package according to an example embodiment.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, another passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
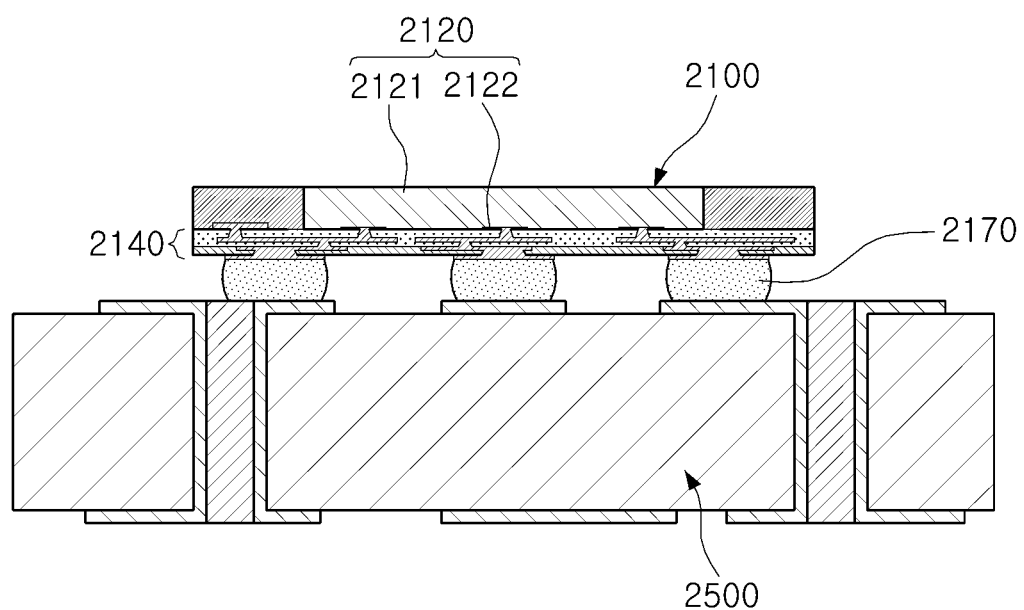
FIG. 8 is a schematic cross-sectional view illustrating a case in which a fan-out semiconductor package is mounted on a mainboard of an electronic device according to an example embodiment.

FIG. 8 is a schematic cross-sectional view illustrating a case in which a fan-out semiconductor package is mounted on a mainboard of an electronic device according to an example embodiment.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a correlation between a horizontal cross-sectional area of a connection pad of a semiconductor chip and the number of individual unit packages obtained in a singulation process will be described with reference to a portion of manufacturing processes of a fan-out semiconductor package.

FIGS. 9A to 9E are schematic cross-sectional views illustrating a portion of a manufacturing process of a fan-out semiconductor package according to an example embodiment.

Figure 9A:
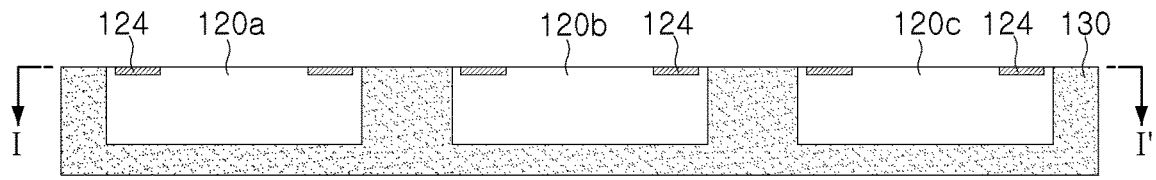
FIGS. 9A to 9E are schematic cross-sectional views illustrating a portion of a manufacturing process of the fan-out semiconductor package according to an example embodiment.

Referring to FIG. 9A, a plurality of semiconductor chips 120a, 120b, and 120c are arranged and fixed. The plurality of semiconductor chips 120a, 120b, and 120c arranged side by side at a predetermined interval are fixed by an encapsulant 130. In FIG. 9A, the encapsulant 130 encapsulates a second surface, opposing a first surface of each of the semiconductor chips 120a, 120b, and 120c on which at least one extension pad 124 is disposed, but is not limited thereto. When an encapsulating material including a photosensitive material encapsulates the first surface of each of the semiconductor chips 120a, 120b, and 120c, forming an insulating layer 141 may be omitted, and a photolithography process may be performed on the encapsulant 130.

Figure 9B:
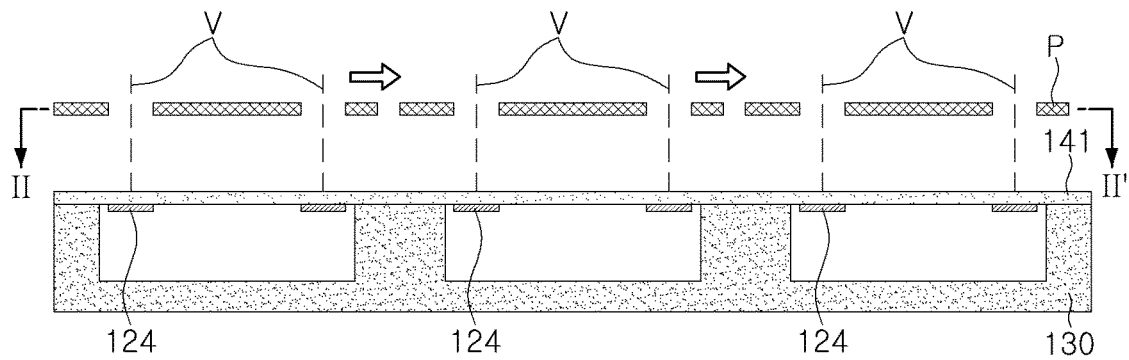
Figure 9C:
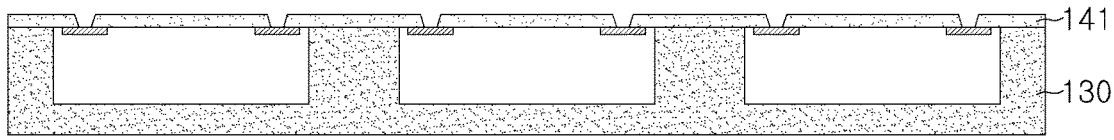
Figure 9D:
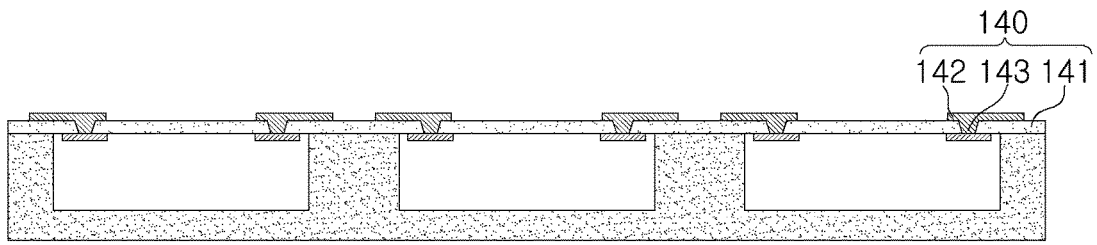

FIGS. 9B to 9D illustrate a photolithography process for forming a connection structure 140 including the insulating layer 141, a redistribution via 143, and a redistribution layer 142. The photolithography process is a process implementing a desired pattern by exposing a photosensitive insulating layer by irradiating light onto a reticle or a photomask on which a circuit pattern is drawn and removing a portion of the photosensitive insulating layer by a developing solution.

Referring to FIG. 9B, an exposure process may be performed on a unit package basis while moving a mask P on which a redistribution circuit pattern or a redistribution via pattern is drawn, but is not limited thereto, and a plurality of package units may be simultaneously exposed. Specifically, (b) of FIG. 9 illustrates a process of forming a redistribution via 143 directly connected to the semiconductor chip. Referring to FIG. 9C, a via hole penetrating through the insulating layer 141 is formed at an exposure point V of the mask P.

Figure 9E:
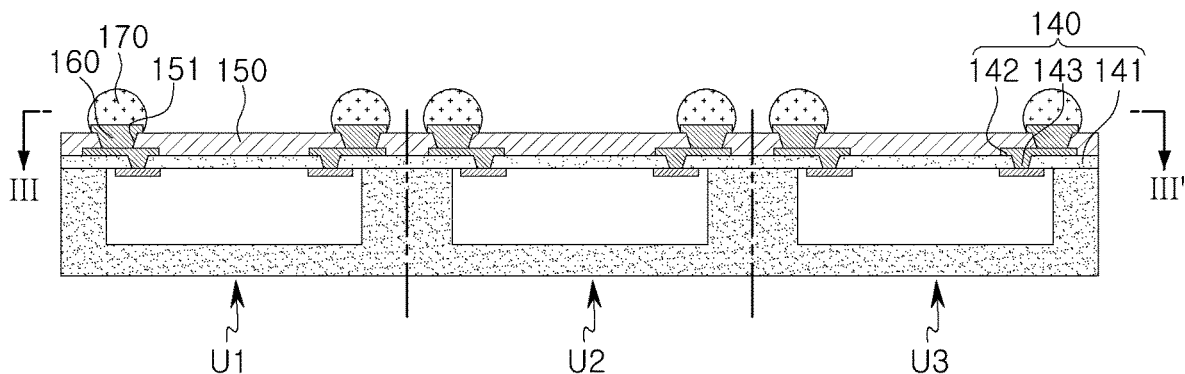

FIG. 9E illustrates a singulation process in which a passivation layer 150, an underbump metal layer 160, and an electrical connection metals 170 are formed on the connection structure 140, and then respective unit packages U1, U2, and U3 are individually separated.

Figure 10:
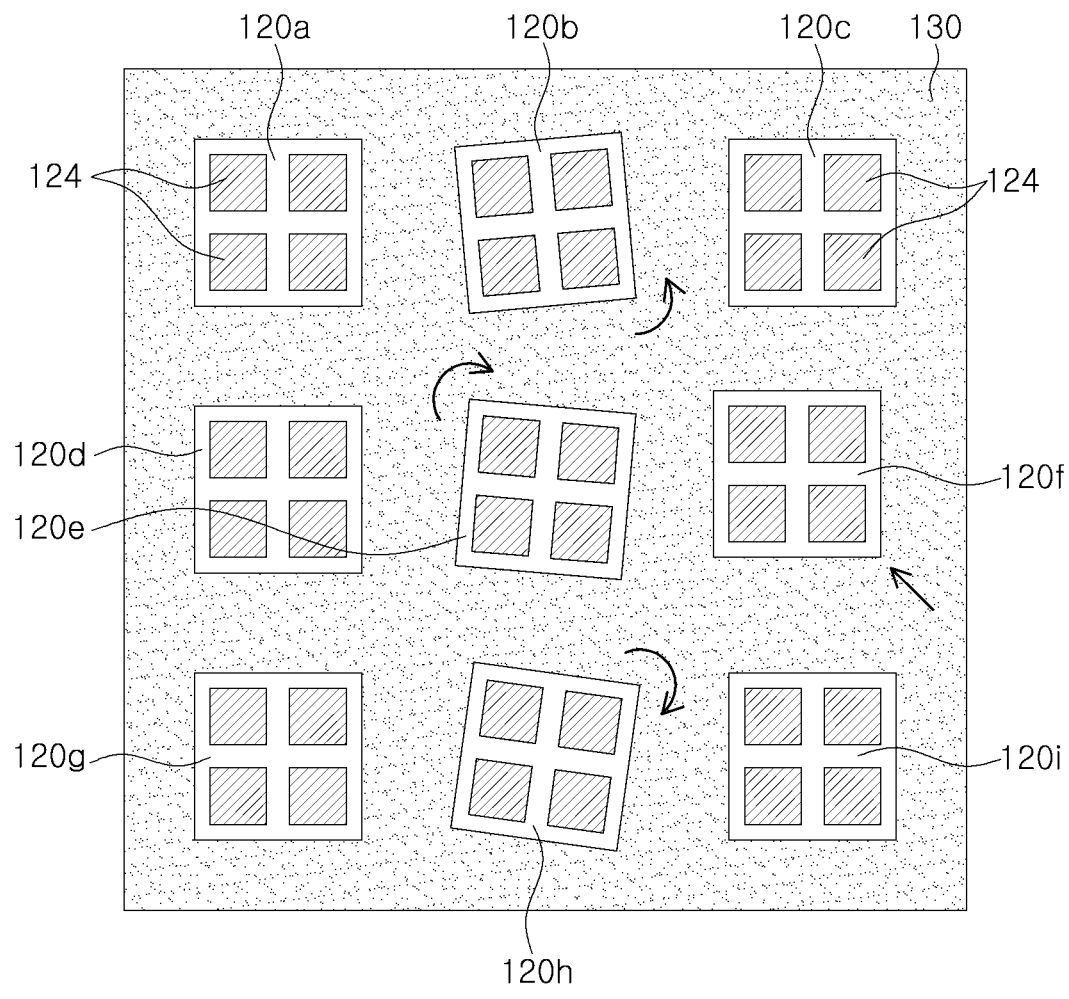
FIG. 10 is a schematic plan view taken along surface I-I' of FIG. 9.

FIG. 10 is a schematic plan view taken along the surface I-I' of FIG. 9.

Referring to FIG. 10, in a process of curing the encapsulant 130, a portion of semiconductor chips 120b, 120e, 120f, and 120h among a plurality of semiconductor chips 120a to 120i are moved or/and rotated to be displaced from an initial position in which the semiconductor chips 120b, 120e, 120f, and 120h are disposed at regular intervals.

Figure 11:
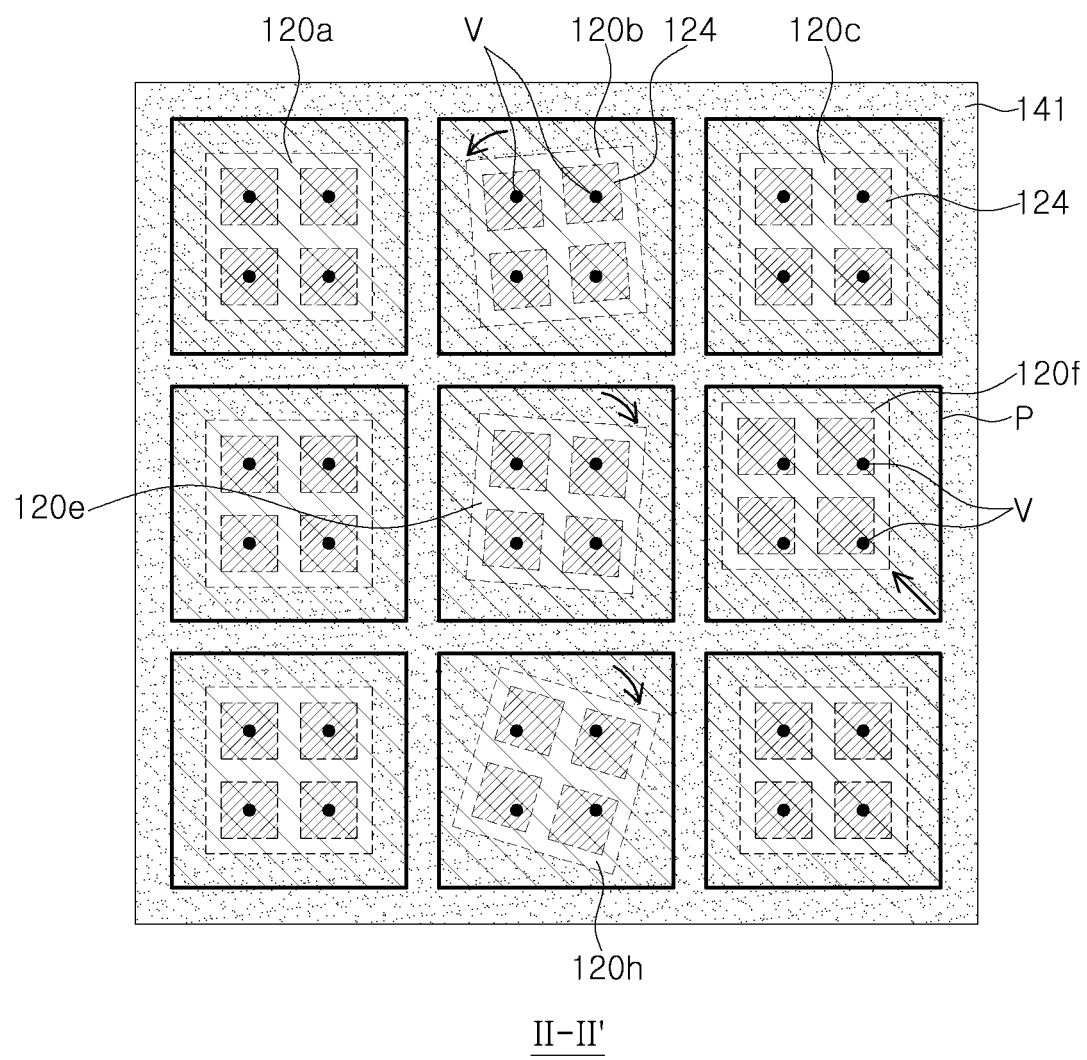
FIG. 11 is a schematic plan view taken along surface II-II' of FIG. 9.

FIG. 11 is a schematic plan view of taken along surface II-II' of FIG. 9.

Referring to FIG. 11, with respect to each of the semiconductor chips 120a to 120i, insulating layer 141 may be formed on an extension pad 124, and an exposure and development process may be performed through a mask P having a redistribution via pattern formed thereon. In this case, the exposure point V is located in the horizontal cross-sectional area of the extension pad 124 without a matching process of the exposure point V of the mask P and the extension pad 124. Therefore, an edge of the mask P may be aligned by side by side, vertically and horizontally, even when a portion of semiconductor chips 120b, 120e, 120f, and 120h are moved or/and rotated.

Figure 12:
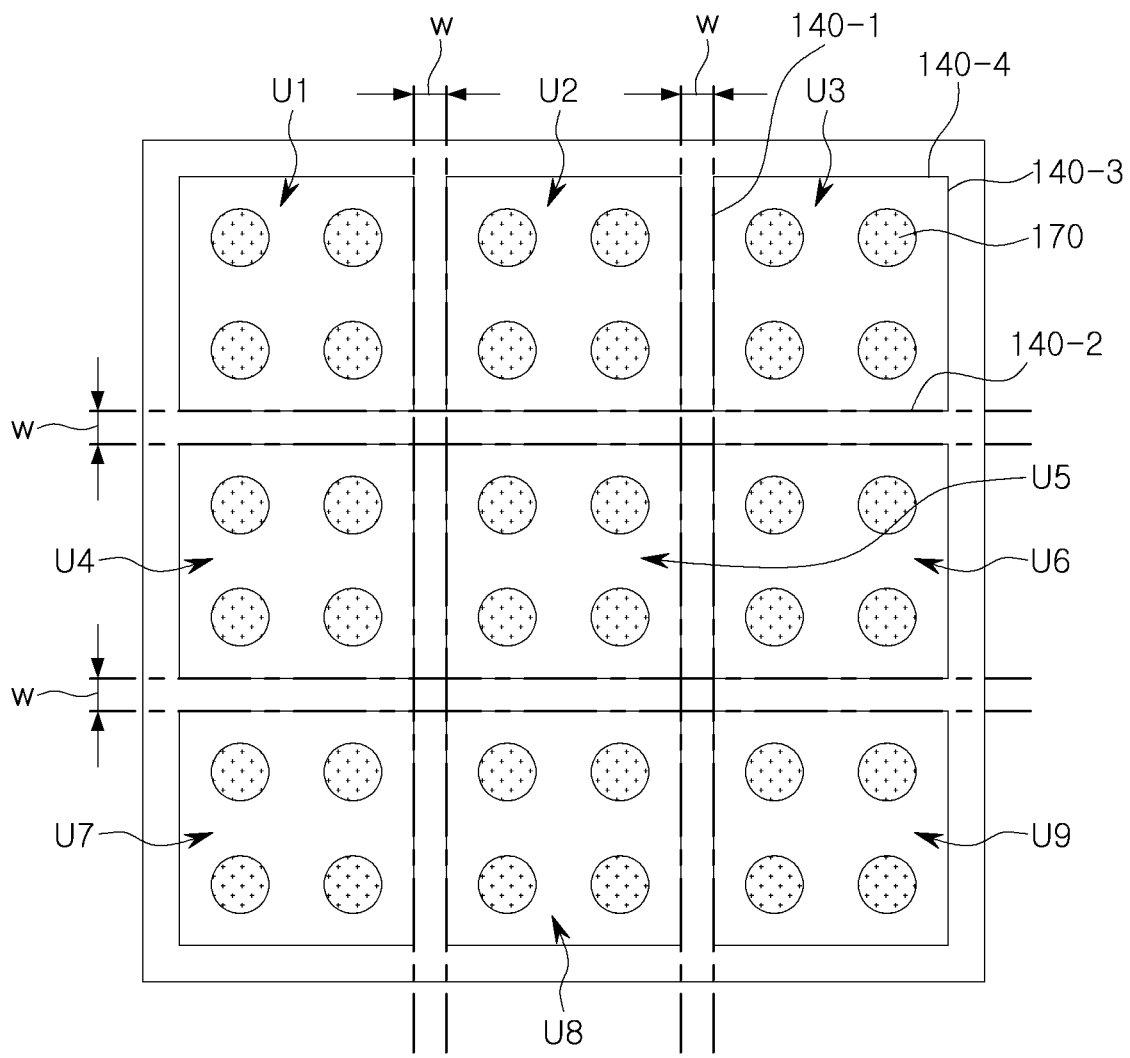
FIG. 12 is a schematic plan view taken along surface of FIG. 9.

FIG. 12 is a schematic plan view taken along surface III-III' of FIG. 9.

Referring to FIG. 12, since outer edges of the connection structure 140 formed in a region of the mask P are aligned side by side, edges 140-1, 140-2, 140-3, and 140-4 of the connection structure 140 of respective unit packages U1 to U8 do not penetrate within the width w of a cutting line. Therefore, individualized unit packages U1 to U8 may be obtained without a unit package cut by sawing.

Figure 13:
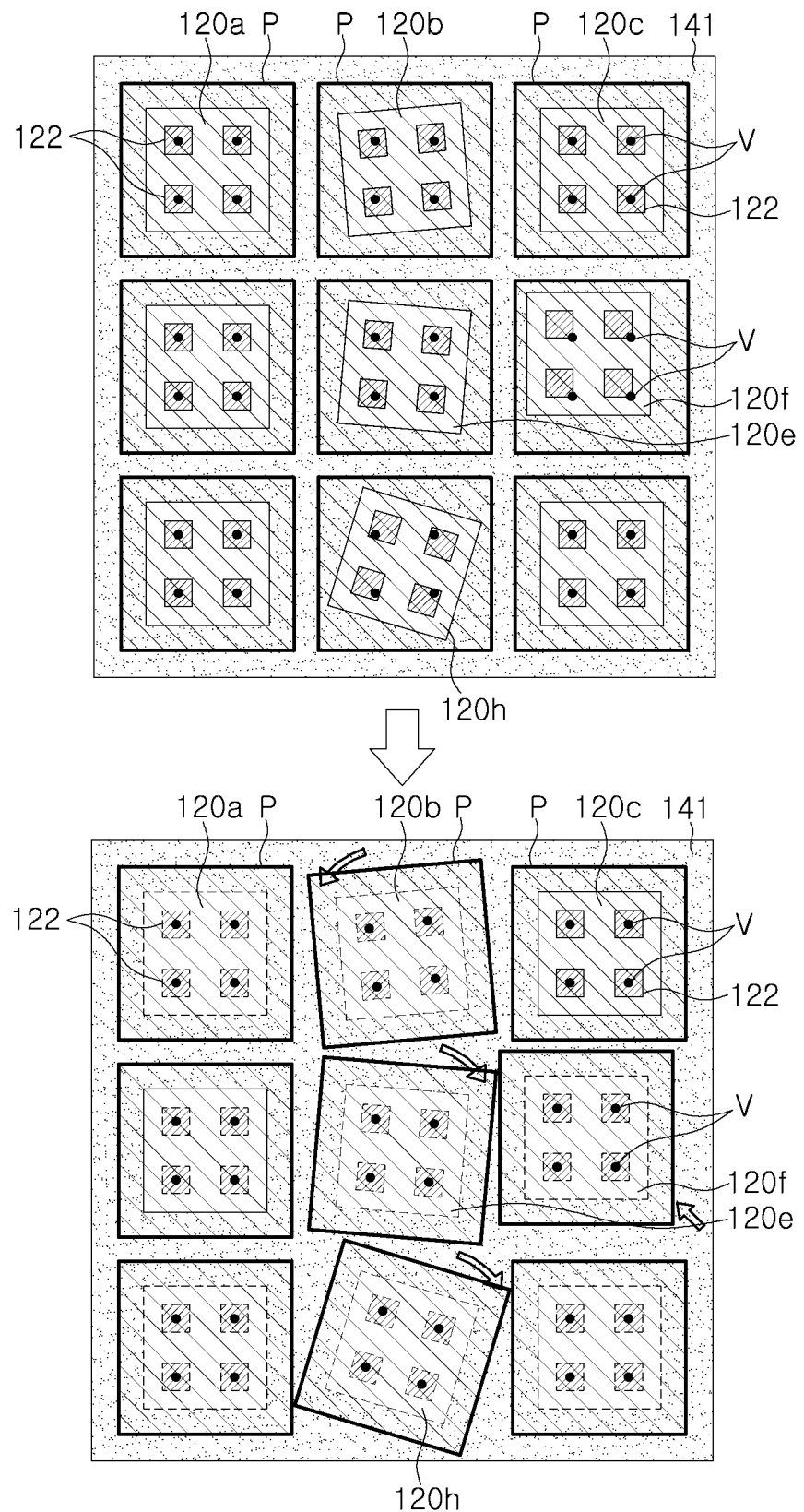
FIGS. 13 to 14 are plan views illustrating a comparative example of FIGS. 11 and 12, respectively.
Figure 14:
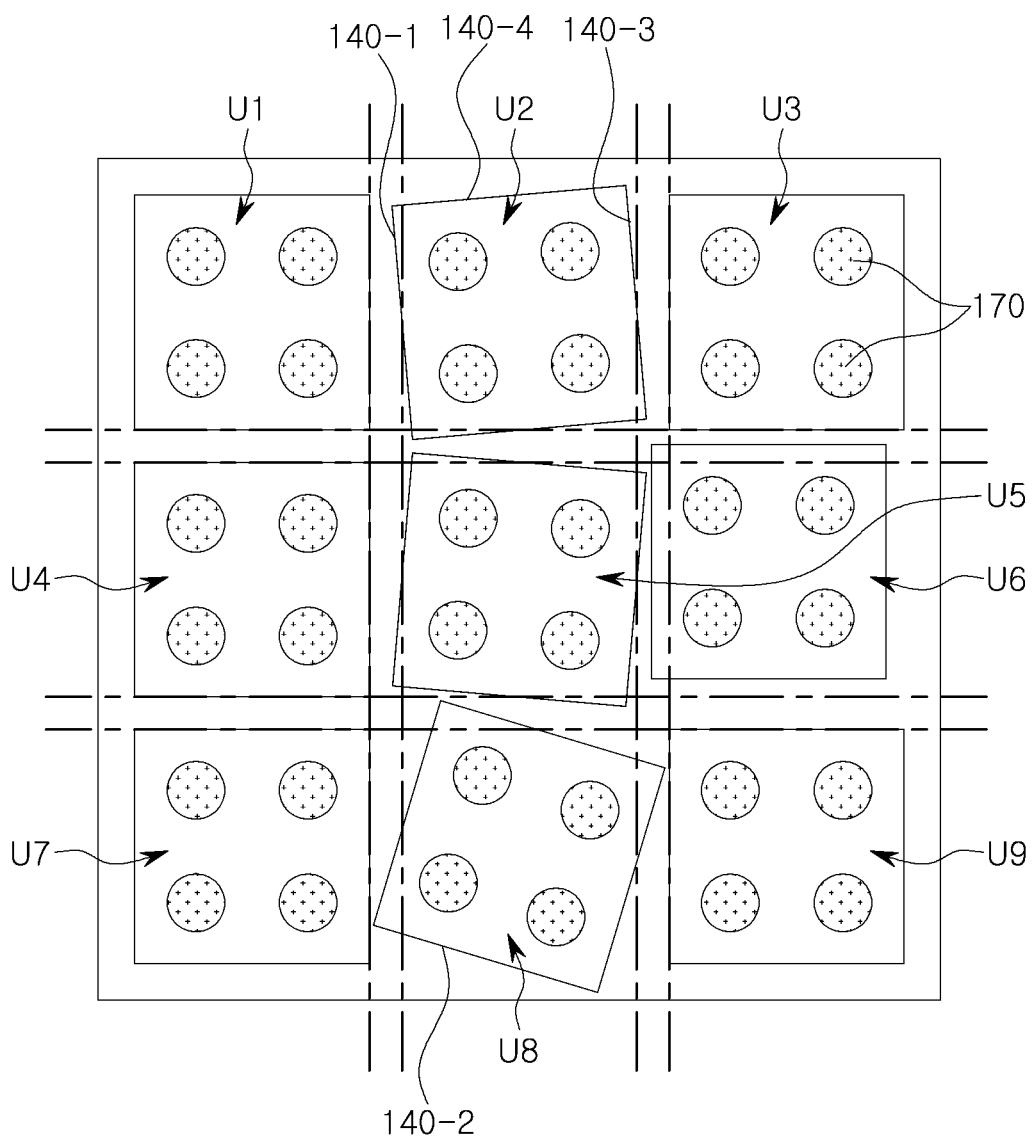

FIGS. 13 to 14 are plan views illustrating a comparative example of FIGS. 11 and 12, respectively.

Referring to FIG. 13, when the horizontal cross-sectional area of the extension pad may not be sufficiently secured, for example, when only a connection pad 122 is included on one surfaces of the semiconductor chips 120a to 120i, a matching process for matching the exposure point V of the mask P and the center of the connection pad 122 may be required. As a result, the position of the connection structure 140 may be changed by displacements of the semiconductor chips 120b, 120e, 120f, and 120h.

Therefore, referring to FIG. 14, a portion of edges 140-1, 140-2, 140-3, and 140-4 of the connection structure 140 may be overlapped within the width w of the cutting line, such that a sift cut may occur in a portion of unit packages U2, U5, U6, and U8. As a result, the number of unit packages to be individually obtained may be reduced. That is, the number of unit packages obtained may be reduced by the number of the unit packages U2, U5, U6 and U8 in which a portion of the internal region of the connection structure 140 are cut.

Hereinafter, various example embodiments of the present inventive concept will be described in detail with reference to the drawings.

Figure 15:
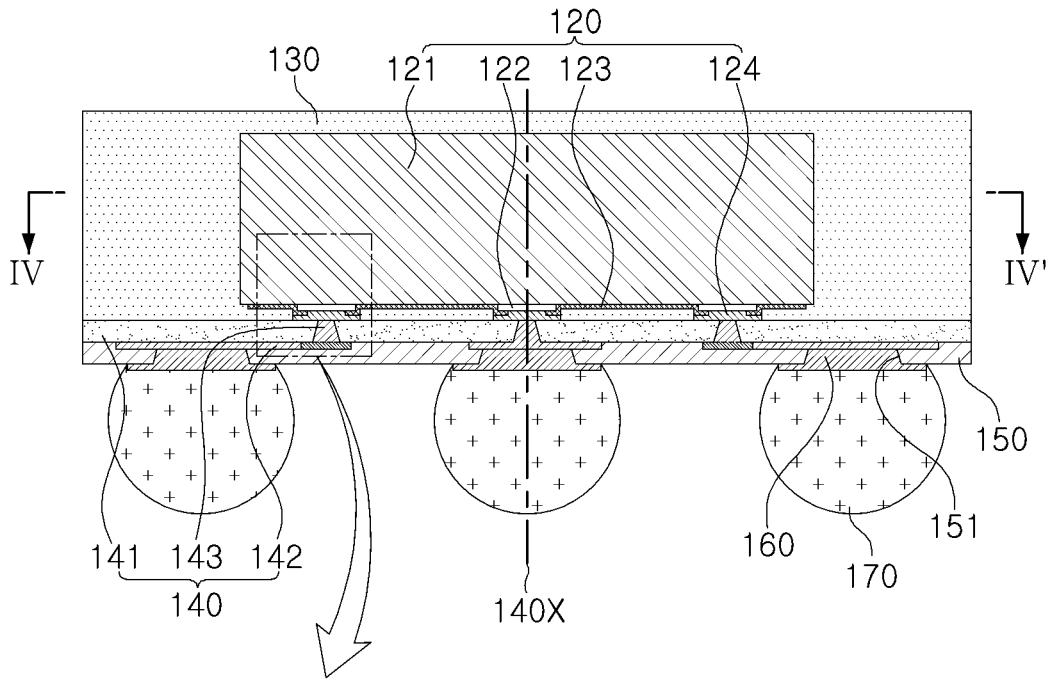
FIG. 15 is a schematic cross-sectional view illustrating a semiconductor package according to an example embodiment.
Figure 15:
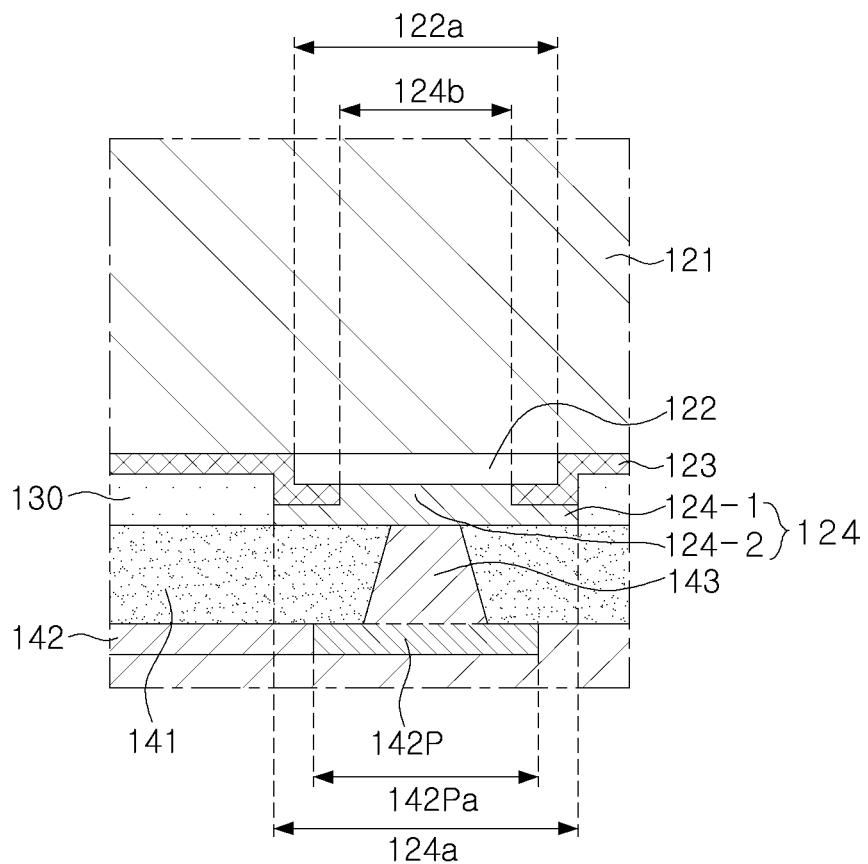
Figure 16:
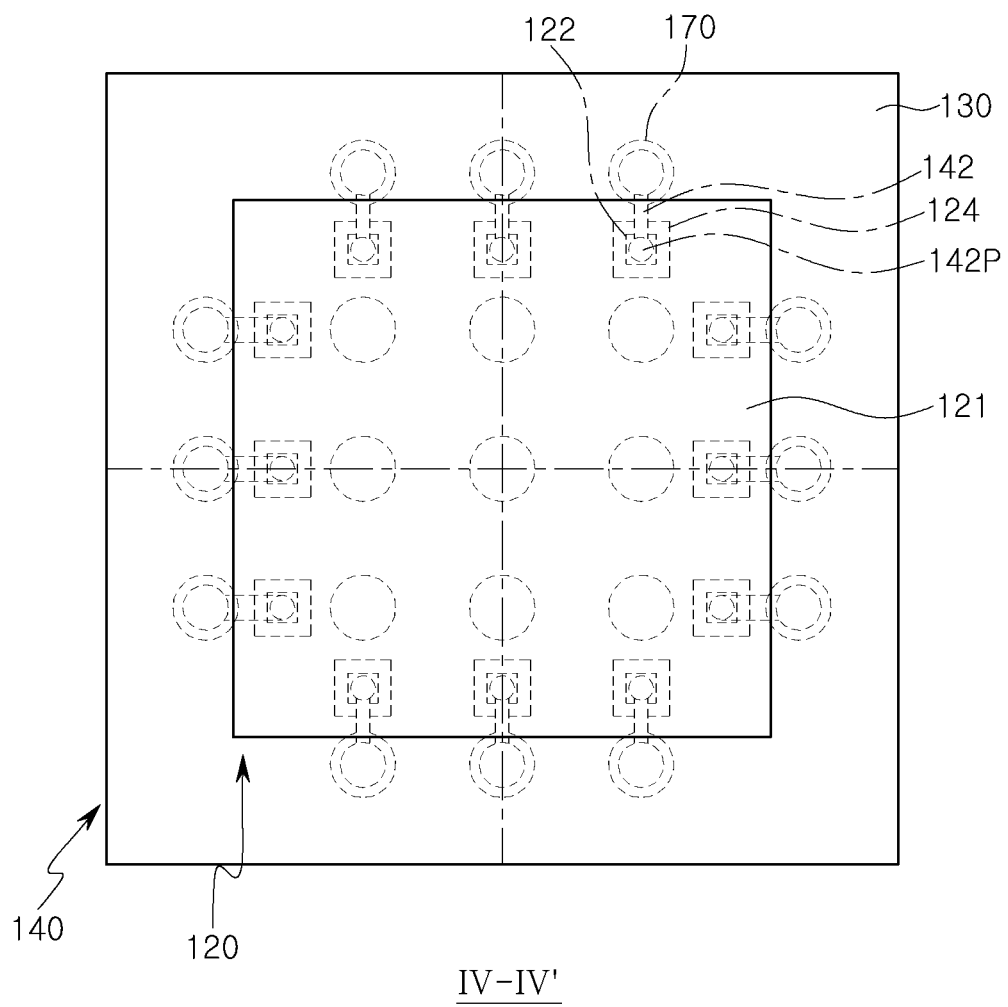
FIG. 16 is a schematic plan view taken along the surface IV-IV' of FIG. 15.

FIG. 15 is a schematic cross-sectional view illustrating a semiconductor package 100A according to an example embodiment, and FIG. 16 is a schematic plan view taken along surface IV-IV' of FIG. 15.

Referring to FIGS. 15 to 16, a semiconductor package 100A according to an example may include a semiconductor chip 120. The semiconductor chip 120 may include a body 121 having a first surface and a second surface, opposing the first surface, a connection pad 122 disposed on the first surface of the body 121, and an extension pad 124 disposed on the connection pad 122. The semiconductor package 100A may also include an encapsulant 130 encapsulating at least a portion of the semiconductor chip 120, and a connection structure 140. The connection structure 140 may include an insulating layer 141 disposed on the first surface of the body 121 of the semiconductor chip 120, a redistribution via 143 penetrating through the insulating layer 141 and having one side in contact with the extension pad 124, and a redistribution layer 142 disposed on the insulating layer 141 and having a via pad 142P in contact with the other side of the redistribution via 143. Here, a horizontal cross-sectional area 124a of the extension pad 124 of the semiconductor chip 120 is greater than a horizontal cross-sectional area 142Pa of the via pad 142P of the redistribution layer 142. The horizontal cross-sectional area 124a of the extension pad 124 of the semiconductor chip 120 is also greater than a horizontal cross-sectional area 122a of the connection pad 122 of the semiconductor chip 120. According to an example embodiment, the extension pad 124 may be a part of the connection structure 140 instead of being included in the semiconductor chip 120.

Generally, a semiconductor package may be manufactured by arranging a plurality of semiconductor chips at a predetermined interval on a carrier substrate, or the like, and then by performing a photolithography process, or the like, for forming a connection structure including a redistribution layer on one side of the semiconductor chip, and then performing a sawing process, a singulation process, or the like, for cutting respective unit packages.

Meanwhile, in the semiconductor package 100A according to an example, the extension pad 124 may be electrically connected to a connection pad 122, and the horizontal cross-sectional area 124a of the extension pad 124 may be greater than the horizontal cross-sectional area 122a of the connection pad 122. Therefore, in the photolithography process for forming the redistribution via 143 of the uppermost layer of the connection structure 140, the electrical connection reliability between one side of the redistribution via 143 and the connection pad 122 by using the extension pad 124 as a medium, may be secured, even when a mask matching process, for aligning an exposure point of a mask or a reticle on which a pattern of the redistribution via 143 is formed on the connection pad 122 of the semiconductor chip, is not performed.

In addition, the other side of the redistribution via 143 may be in contact with a via pad 142P formed in a portion of the redistribution layer 142. The via pad 142P is a connection portion of the redistribution via 143 and the redistribution layer 142, and may have a width greater than a circuit width of the redistribution layer 142. A horizontal cross-sectional area 142Pa of the via pad 142P may be equal to or smaller than a horizontal cross-sectional area 124a of the extension pad 124, and a shape of the redistribution via 143 may be a tapered shape having a smaller diameter toward one side of the redistribution via 143. Matching of the extension pad 124, the redistribution via 143, and the redistribution layer 142 may be ensured without a mask matching process from the shapes of the via pad 142P and the redistribution via 143.

In addition, in a semiconductor package 100A according to an example, since the mask matching process for aligning the exposure point of the mask or the reticle on the connection pad 122 of the semiconductor chip 120 is not performed in a photolithography process forming the connection structure 140, it is possible to align edges of the mask or the reticle to be an outer edge of the connection structure 140 side by side, and it is possible to prevent defects such as a sift cut in which an edge of the connection structure 140 is cut in a sawing process. Accordingly, by increasing the number of unit packages to be obtained by significantly reducing a dispositional interval of the semiconductor chip 120, productivity may be improved, and a lead time and production costs may be reduced.

On the other hand, when the horizontal cross-sectional area 124a of the extension pad 124 is not sufficiently secured, since the mask matching process for aligning the exposure point of the mask or the reticle on the connection pad 122 of the semiconductor chip in the photolithography process should be performed, the edge of the mask to be the outer edge of the connection structure 140 may not be aligned side by side, and defects such as a sift cut in which the edge of the connection structure 140 is cut in the sawing process may occur (see. FIGS. 13 to 14). Therefore, a ratio (124a/122a) of the horizontal cross-sectional area 124a of the extension pad 124 to the horizontal cross-sectional area 122a of the connection pad 122 may be 2:1 to 6:1, preferably 3:1 to 5:1, more preferably 4:1 to 5:1, and most preferably 5:1, but not necessarily. When the ratio (124a/122a) of the horizontal cross-sectional area 124a of the extension pad 124 to the horizontal cross-sectional area 122a of the connection pad 122 exceeds 6:1, a short between the extension pads 124 may occur, and when the ratio (124a/122a) thereof is less than 2:1, the exposure point of the mask or the reticle may not be located in the extension pad 124 in the photolithography process.

Meanwhile, the semiconductor package 100A according to an example may further include a passivation film (or layer) 123 disposed on the first surface of the semiconductor chip 120, in which at least a portion of the passivation film 123 is disposed between the connection pad 122 and the extension pad 124, and having an opening exposing at least a portion of the connection pad 122. In this case, the extension pad 124 may have a connection portion 124-2 filling an opening of the passivation film 123 and an extension portion 124-1 formed on the passivation film 123 and in contact with the redistribution via 143. The horizontal cross-sectional area 124a of the extension portion 124-1 of the extension pad may be greater than the horizontal cross-sectional area 124b of the connection portion 124-2, and the horizontal cross-sectional area 142Pa of the via pad 142P may be smaller than the horizontal cross-sectional area 124a of the extension portion 124-1 of the extension pad.

In this case, the ratio (124a/124b) of the horizontal cross-sectional area 124a of the extension portion 124-1 of the extension pad to the horizontal cross-sectional area 124b of the connection portion 124-2 of the extension pad 124 may be 2:1 to 6:1, preferably be 3:1 to 5:1, more preferably be 4:1 to 5:1, and most preferably be 5:1.

Hereinafter, each configuration included in the semiconductor package 100A according to an example will be described in more detail.

The semiconductor chip 120 may be an integrated circuit (IC) provided in an amount of several hundred to several million or more elements integrated in a single chip. The semiconductor chip 120 may be formed on the basis of an active wafer. In this case, a base material of the body 121 of the semiconductor chip 120 may be silicon (Si), germanium (Ge), gallium arsenide (GaAs), or the like. Various circuits may be formed on the body 121.

The connection pads 122 may electrically connect the semiconductor chip 120 to other components. A material of each of the connection pads 122 may be a conductive material such as aluminum (Al), or the like without any particular limitation. A surface on which the connection pad 122 is disposed may be an active surface, and an opposite side thereof may be an inactive surface. The passivation film 123 covering at least a portion of the connection pad 122 may be formed on the body 121 as required.

The passivation film 123 may be an oxide film, a nitride film, or the like, or may be a double layer of an oxide film and a nitride film. An insulating film (not shown), or the like may be further disposed at a necessary position. The semiconductor chip 120 may be a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like, and a logic chip such as an analog-to-digital converter, an application-specific integrated circuit (ASIC), or the like. However, the semiconductor chip 120 is not limited thereto.

Meanwhile, in the semiconductor package 100A according to an according to an example embodiment, a material of forming the extension pad 124 may be a conductive material such as cooper (Cu), aluminum (Al), and the like, without any particular limitation. The horizontal cross-sectional area 124a of the extension pad 124 may be greater than the horizontal cross-sectional area 122a of the connection pad 122 of the semiconductor chip, as described above.

Considering both the size of the extension pad 124 and a fine pitch of the integrated circuit built in the semiconductor chip 120 not to perform the mask matching process in the photolithography process, the ratio (124a/122a) of the horizontal cross-sectional area of the extension pad to the horizontal cross-sectional area 122a of the connection pad may be 2:1 to 6:1, preferably 3:1 to 5:1, more preferably 4:1 to 5:1, and most preferably 5:1, as described above.

In addition, when the passivation film 123 is included, the extension pad 124 may have the connection portion 124-2 filling an opening of the passivation film 123 and in contact with the connection pad 122 and an extension portion 124-1 formed on the passivation film 123 and in contact with the redistribution via 143. The ratio (124a/124b) of the horizontal cross-sectional area 124a of the extension portion 124-1 of the extension pad to the horizontal cross-sectional area 124b of the connection portion 124-2 of the extension pad 124 may be 2:1 to 6:1, preferably 3:1 to 5:1, more preferably 4:1 to 5:1, and the most preferably 5:1, as described above.

The encapsulant 130 may include an insulating material. As the insulating material, a material including an inorganic filler and an insulating resin, for example, a thermosetting resin such as an epoxy resin, a thermoplastic resin such as a polyimide resin, or a resin in which a reinforcing material such as an inorganic filler is included therein, specifically, Ajinomoto build-up film (ABF), Flame Resistant 4 (FR-4), and Bismaleimide Triazine (BT) may be used. In addition, epoxy molding compound (EMC), photo imageable encapsulant (PIE), or the like, may also be used. A material in which an insulating resin such as the thermosetting resin or the thermoplastic resin is impregnated in an inorganic filler and/or a core material such as a glass fiber, or the like, may be used as required.

Several tens to several hundreds of connection pads 122 of the semiconductor chip 120 having various functions may be redistributed by the connection structure 140. The connection structure 140 may include the insulating layer 141 disposed on the active surface of the semiconductor chip 120, the redistribution layer 142 disposed on the insulating layer 141, and the redistribution via 143 connecting the redistribution layer 142 and the connection pad 122 of the semiconductor chip 120. The connection structure 140 may include a more number of insulating layers, redistribution layers, and redistribution vias than illustrated in the drawings.

A material of the insulating layer 141 may be an insulating material. In this case, a photosensitive insulating material such as a PID resin may also be used as the insulating material besides the aforementioned insulating material. That is, each of the insulating layers 141 may be a photosensitive insulating layer. In the case in which the insulating layer 141 has photosensitive properties, the thickness of the insulating layer 141 may be further reduced, and a fine pitch of the redistribution via 143 may be achieved more easily.

Each of the insulating layers 141 may be a photosensitive insulating layer including an insulating resin and an inorganic filler.

In the case in which the insulating layer 141 are formed of multiple layers, the materials of the insulating layers 141 may be the same, or may be different from one another, if necessary. In the case in which the insulating layers 141 are formed of multiple layers, the multiple layers may be integrated with one another depending on processes, such that a boundary therebetween may not be readily apparent. The number of the layers, greater than those illustrated in the drawings, may be provided.

The redistribution layer 142 may substantially serve to redistribute the connection pad 122, and may be formed of a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of corresponding layers. For example, the redistribution layer 142 may include ground (GND) pattern layers, and may include power (PWR) patterns, signal (S) patterns, and the like. Here, the signal (S) patterns may include various signals except for the ground (GND) signals, the power (PWR) signals, and the like, such as data signals, and the like.

In addition, the redistribution layer 142 is a portion connecting the redistribution via 143 and the underbump metal layer 160, and may include the via pad 142P. The via pad 142P may have a width, greater than a circuit width of the redistribution layer 142, and may be electrically connected to the redistribution via 143. In this case, a horizontal cross-sectional area of the via pad 142P may be smaller than the horizontal cross-sectional area 124a of the extension pad 124. When such a large and small relationship is satisfied, process matching of the redistribution via 143 with respect to the extension pad 124 may be further improved.

The redistribution via 143 may electrically connect the redistribution layer 142, the connection pad 122, and the like, formed on different layers, from one another, resulting in an electrical path in the semiconductor package 100A. A material forming the redistribution vias 143 may be a conductive material such as copper (Cu), aluminum (Al), silver (Ag), tin (Sn), gold (Au), nickel (Ni), lead (Pb), titanium (Ti), or alloys thereof. Each of the redistribution vias 143 may be completely filled with a conductive material, or the conductive material may be formed along a wall of the redistribution vias. In addition, the redistribution via 143 may have all shapes known in the related art, such as a tapered shape, a cylindrical shape, and the like.

The passivation layer 150, which can be used as needed, may protect the redistribution layer 142 from an external physical or chemical damage. The passivation layer 150 may have a portion of the redistribution layer 142, that is, an opening portion 151 opening at least a portion of a pad to which an external connection terminal (hereinafter, 'electrical connection structure') is connected. The number of opening portions, formed in the passivation layer 150, may be several tens to several thousands.

A material forming the passivation layer 150 is not particularly limited. For example, a photosensitive insulating material such as a photosensitive insulating resin may be used as the material of the passivation layer 150. Alternatively, a solder resist may also be used. Alternately, an insulating material including a filler and a resin but not including glass cloth, such as ABF, or the like, may be used. Surface roughness of the passivation layer 150 may be lower than that of a general case. When the surface roughness is low as described above, it is possible to improve various side effects that may occur during a circuit forming process, for example, occurrence of surface stains and difficulties in implementing a microcircuit, and the like.

The underbump metal layer 160 may improve connection reliability of an electrical connection metals 170, to be described later, which may be introduced as needed, resulting in improving the reliability. The underbump metal layer 160 may be formed in the insulating layer 141 or in the opening portion 151 of the passivation layer 150 to be connected to the opened redistribution layer 142. The underbump metal layer 160 may include a seed layer and a conductor layer formed on the seed layer. The seed layer and the conductor layer may include any known conductive material, but may preferably include electroless copper and electrolytic copper, respectively. The seed layer may be thinner than the conductor layer.

The electrical connection metal 170 may be formed as a multilayer or a single layer. When the electrical connection metal 170 is formed as a multilayer, the electrical connection metal may include a copper pillar and a solder. When the electrical connection metal 170 is formed as a single layer, the electrical connection metal may include a tin-silver solder or copper. However, it is merely an example, and the present inventive concept is not limited thereto. The number, an interval, a dispositional form, and the like, of the electrical connection metals 170 are not particularly limited, but may be sufficiently modified depending on design particulars by those skilled in the art. For example, the electrical connection metals 170 may be provided in an amount of several tens to several thousands, or may be provided in an amount of several tens to several thousands or more or several tens to several thousands or less.

At least one of the electrical connection metals 170 and/or at least one of the underbump metal layers 160 may be disposed in a fan-out region of the semiconductor chip 120. The fan-out region may refer to a region except for a region in which the semiconductor chip 120 is disposed. That is, the semiconductor package 100A according to the example embodiment may be a fan-out package. The fan-out package may have excellent reliability as compared to a fan-in package, may allow a plurality of I/O terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

Figure 17:
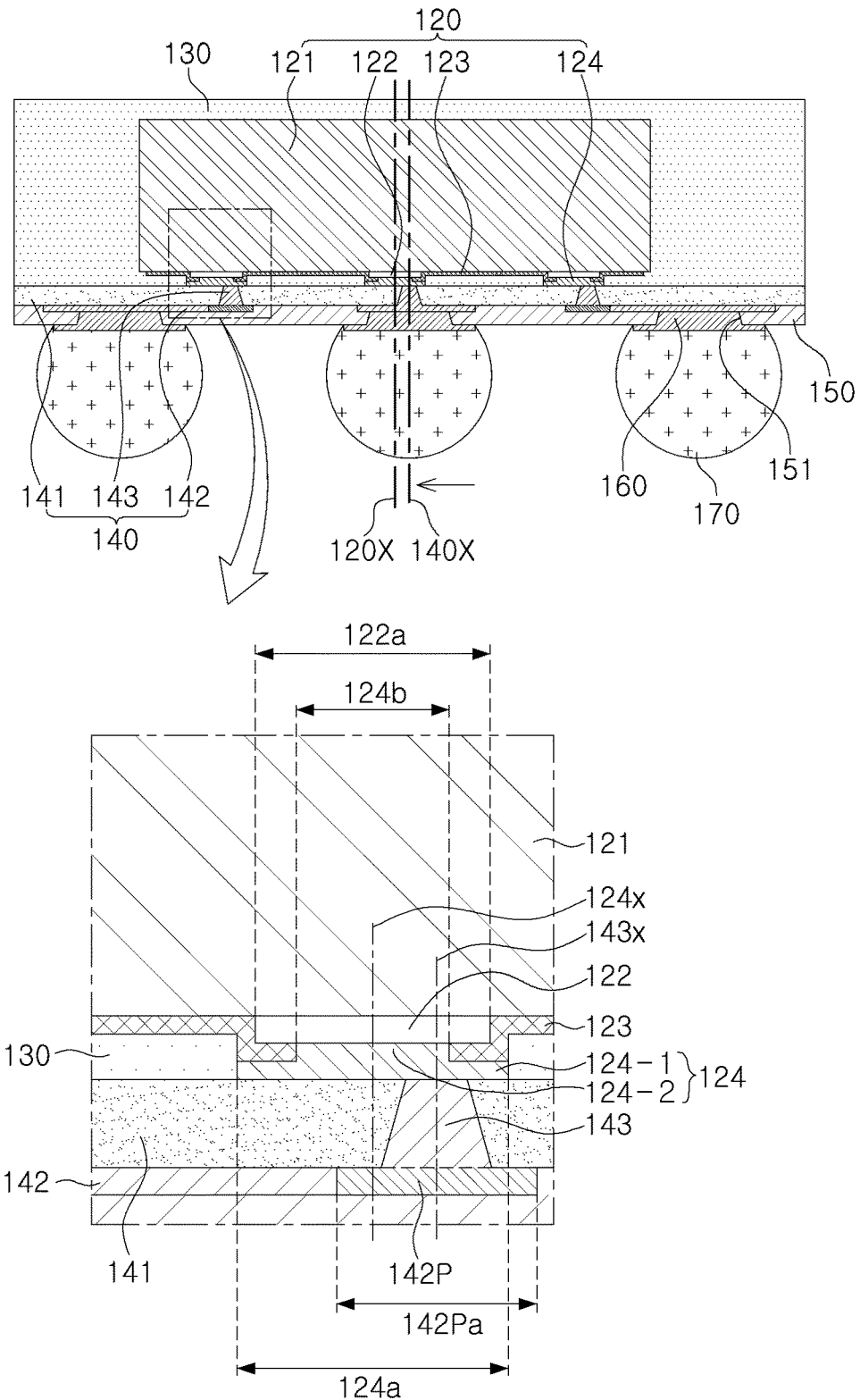
FIG. 17 is a schematic cross-sectional view illustrating a semiconductor package according to an example embodiment.

FIG. 17 is a schematic cross-sectional view illustrating a semiconductor package 100B according to an example embodiment.

Referring to FIG. 17, in the semiconductor package 100B according to an example embodiment, since a mask matching process for aligning an exposure point of a mask or a reticle on a connection pad 122 of a semiconductor chip 120 is not performed in a photolithography process, a redistribution via 143 formed around the exposure point of the mask may not be located in a central portion of an extension pad 124 disposed on one surface of the semiconductor chip 120. That is, at least a portion of a surface of the redistribution via 143 in contact with the extension pad 124 may be disposed to be outside of a region overlapping the connection pad 122 on a plane.

For example, when a center axis 120x of the semiconductor chip 120 is disposed to be shifted from a center axis 140x of the connection structure 140, a center axis 124x of the extension pad 124 may be disposed to be shifted from a center axis 143x of the redistribution via 143. In this case, an interval between the center axis 120x of the semiconductor chip and the center axis 140x of the connection structure may be the same as an interval between the center axis 124x of the extension pad and the center axis 143x of the redistribution via.

For example, when the semiconductor chip 120 is rotated centered on the center axis 120X thereof in a state in which the center axis 120x of the semiconductor chip 120 and the center axis 140x of the connection structure are overlapped with each other, the center axis 120x of the semiconductor chip may be disposed on the same line as the center axis 140x of the connection structure, and the extension pad may be disposed to be shifted from the center axis 143x of the redistribution via 143. Here, the center axis 124x of the extension pad 124 and the center axis 143x of the redistribution via 143 may be interpreted as a center axis 124x of each of at least portions of a plurality of extension pads 124 and a center axis 143x of each of at least portions of a plurality of redistribution vias 143, respectively.

Meanwhile, when the semiconductor package 100B according to an example embodiment further includes a passivation film 123, the extension pad 124 may have an extension portion 124-1 and a connection portion 124-2, and at least a portion of the surface of the redistribution via 143 in contact with the extension portion 124-1 of the extension pad 124 may be disposed to be disposed to be outside of a region overlapping the connection portion 124-2 of the extension pad 124 on a plane.

Other configurations are substantially the same as those described in the semiconductor package 100A, and thus a detailed description thereof will be omitted.

Figure 18:
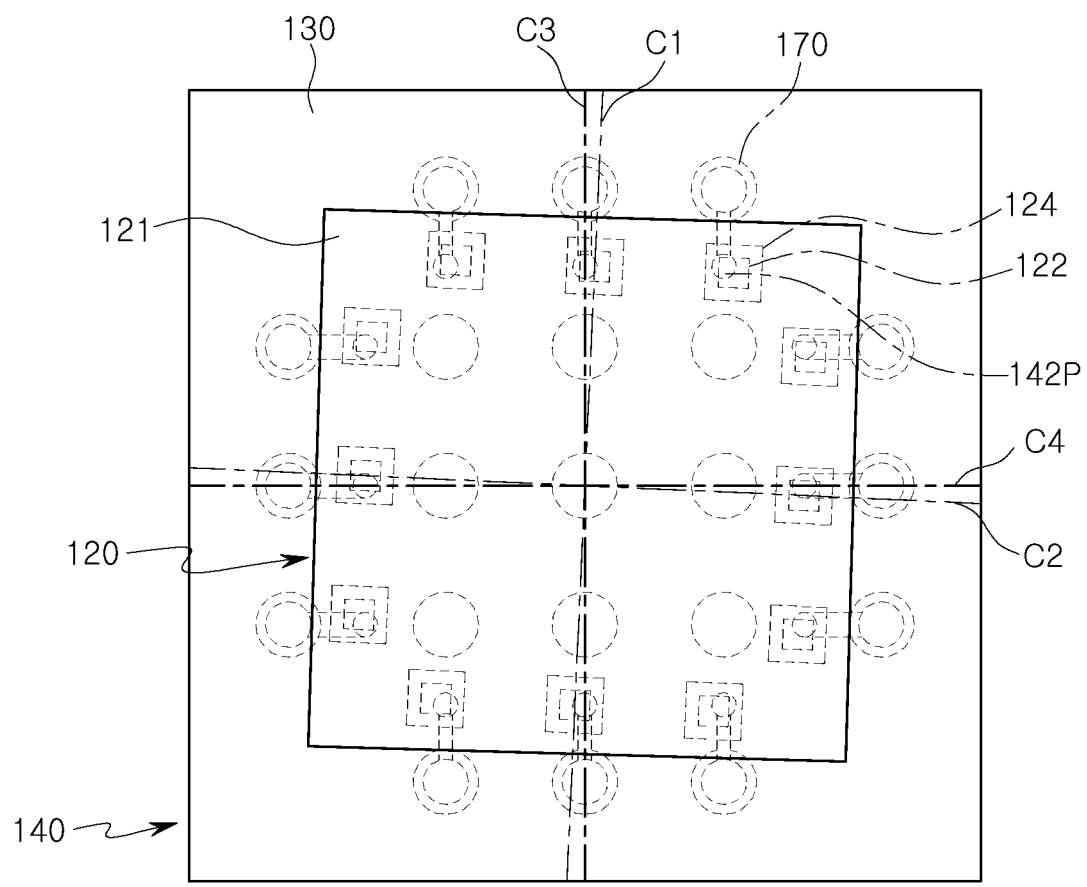
FIG. 18 is a schematic cross-sectional view illustrating a semiconductor package according to an example embodiment.
Figure 19:
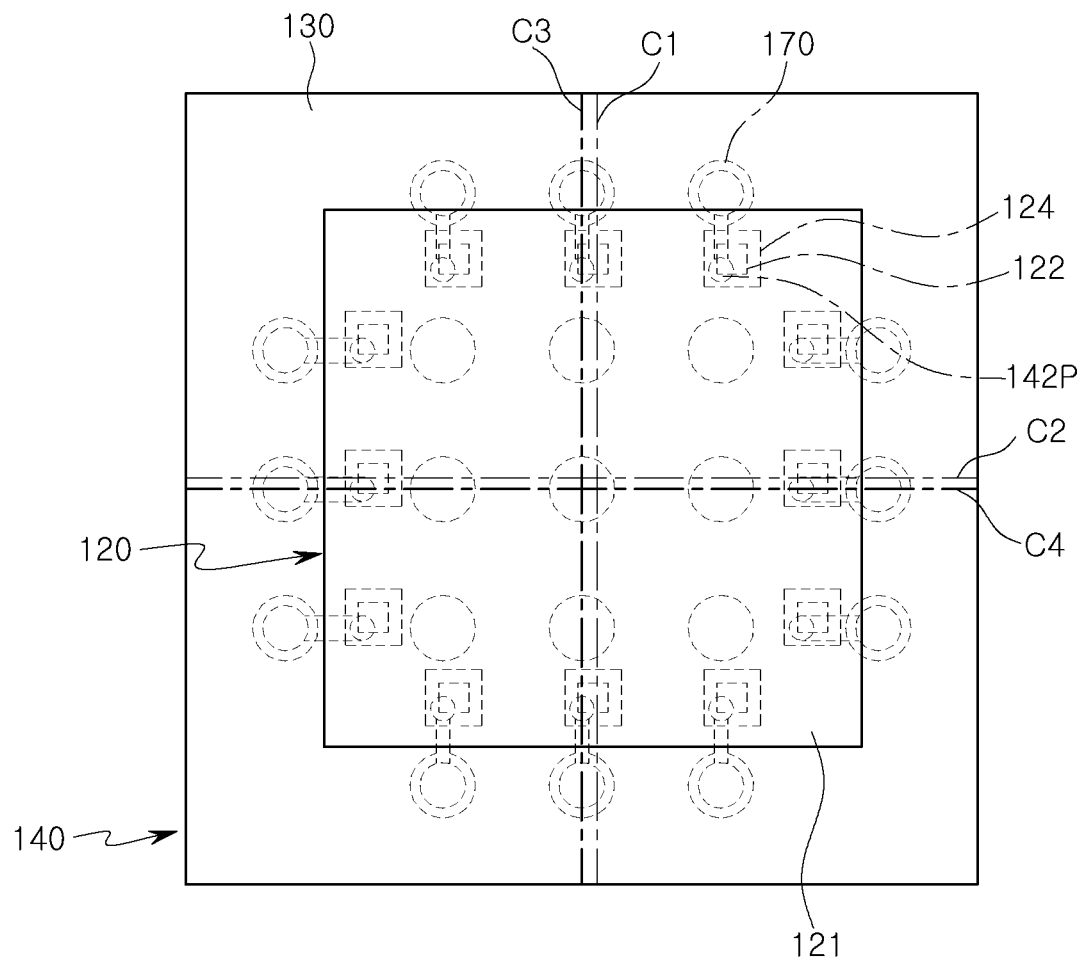
FIG. 19 is a schematic cross-sectional view illustrating a semiconductor package according to an example embodiment.
Figure 20:
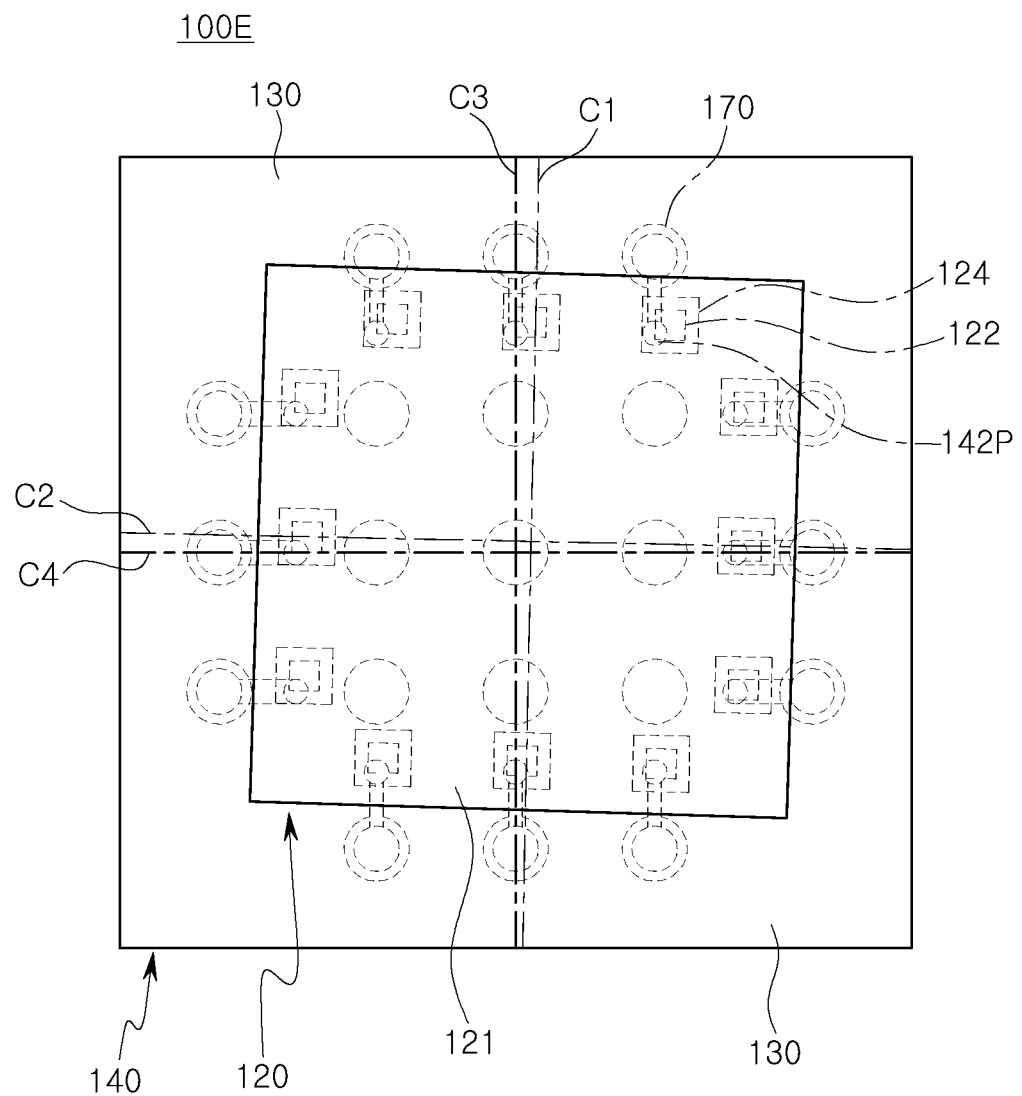
FIG. 20 is a schematic cross-sectional view illustrating a semiconductor package according to an example embodiment.

FIGS. 18 to 20 are schematic cross-sectional views illustrating semiconductor packages 100C to 100E according to example embodiments.

In the semiconductor packages 100C to 100E according to example embodiments, a semiconductor chip 120 may be located in a horizontal cross-sectional region of a connection structure 140. A first reference line C1, parallel to a first edge of one side of the semiconductor chip 120 and a second reference line C2, parallel to a second edge of another side of the semiconductor chip 120, orthogonal to each other at the center of the semiconductor chip 120 may have predetermined displacements, respectively, with respect to a third reference line C3, parallel to a third edge of one side of the connection structure 140 and a fourth reference line C4, parallel to a fourth edge of another side of the connection structure 140, orthogonal to each other at the center of the connection structure 140.

Referring to FIG. 18, in the semiconductor package 100C according to an example embodiment, the center of the semiconductor chip 120 is disposed to overlap with the center of the connection structure 140, and the first reference line C1 and/or the second reference line C2 may form an acute angle with the third reference line C3 and/or the fourth reference line C4, respectively, adjacent to each other. For example, the first reference line C1 may form an acute angle with the third reference line C3 or the fourth reference line C4, respectively, adjacent to each other, or may form an acute angle with the third reference line C3 and the fourth reference line C4, and/or the second reference line C2 may form an acute angle the third reference line C3 or the fourth reference line C4, respectively, adjacent to each other, or may form an acute angle with the third reference line C3 and the fourth reference line C4.

Referring to FIG. 19, in the semiconductor package 100D according to an example embodiment, the center of the semiconductor chip 120 may be disposed to be shifted from the center of the connection structure 140, and the first reference line C1 and/or the second reference line C2 may be parallel to the third reference line C3 and/or the fourth reference line C4 spaced apart by a predetermined interval, respectively. For example, the first reference line C1 may be spaced apart from the third reference line C3 by a predetermined distance, and/or the second reference line C2 may be spaced apart from the fourth reference line C4 by a predetermined distance.

Referring to FIG. 20, in the semiconductor package 100E according to an example embodiment, the center of the semiconductor chip 120 may be disposed to be offset from the center of the connection structure 140, and the first reference line C1 and/or the second reference line C2 may form an acute angle with the third reference line C3 and/or the fourth reference line C4, respectively, adjacent to each other. For example, the first reference line C1 may form an acute angle with the third reference line C3 or the fourth reference line C4, respectively, adjacent to each other, or may form an acute angel with the third reference line C3 and the fourth reference line C4, and/or the second reference line C2 may form an acute angle with the third reference line C3 or the fourth reference line C4, respectively, adjacent to each other, or may form an acute angle with the third reference line C3 and the fourth reference line C4.

Other configurations are substantially the same as those described in the semiconductor package 100A described above, and thus a detailed description thereof will be omitted.

Figure 21:
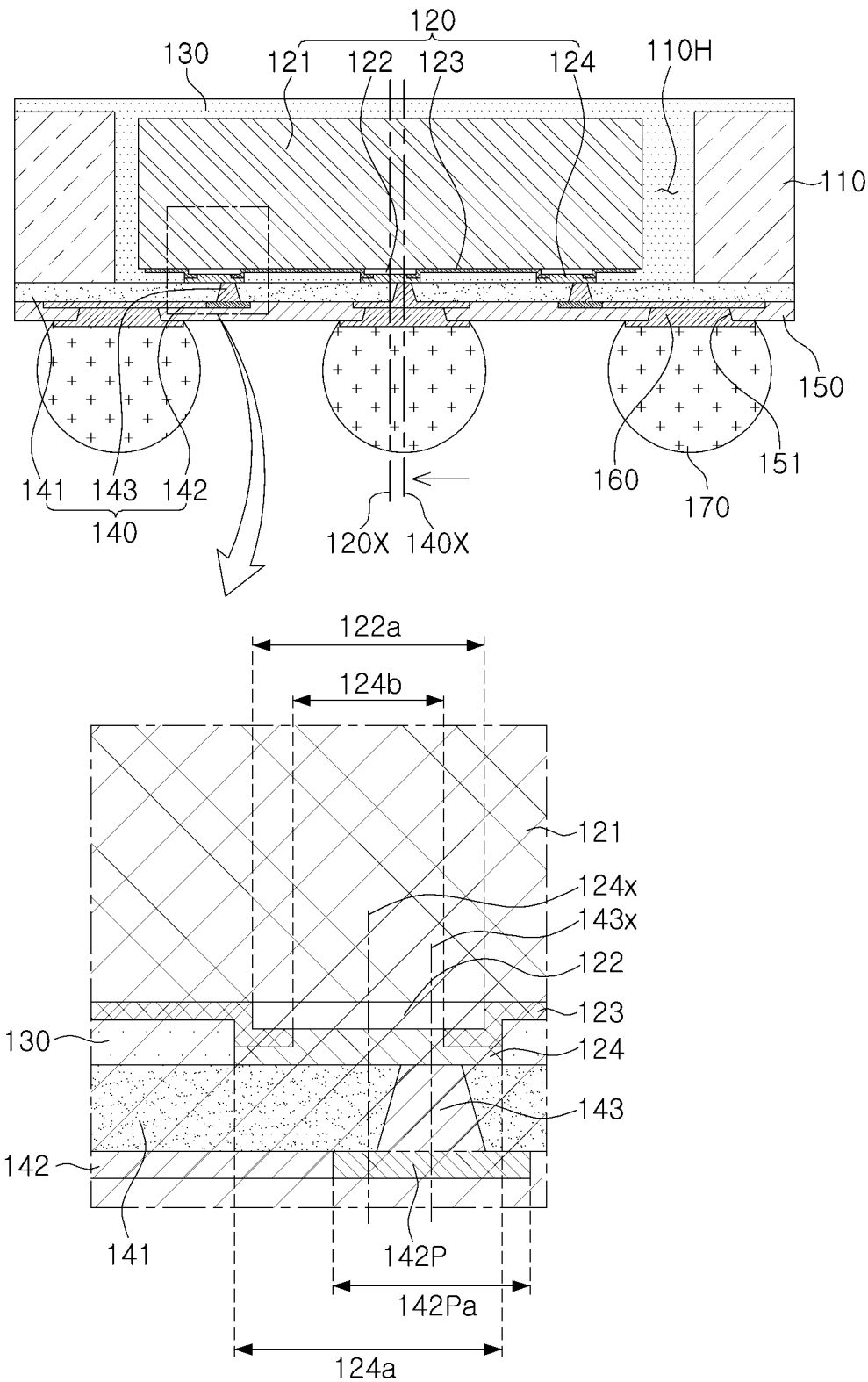
FIG. 21 is a schematic cross-sectional view illustrating a semiconductor package according to an example embodiment.

FIG. 21 is a schematic cross-sectional view illustrating a semiconductor package 100F according to an example embodiment.

Referring to FIG. 21, the semiconductor package 100F according to an example embodiment may further include a frame 110 having a through hole 110H in which a semiconductor chip 120 is disposed. In this case, a center axis 124x of an extension pad 124 may be disposed to be shifted from a center axis 143x of a redistribution via 143, and a center axis 120x of the semiconductor chip 120 may be disposed to be shifted from the center axis of the through hole 110H and/or the center axis 140x of a connection structure 140. Here, the center axis 124x of the extension pad 124 and the center axis 143x of the redistribution via 143 may be interpreted as a center axis 124x of each of at least portions of a plurality of extension pads 124 and a center axis 143x of each of at least portions of a plurality of redistribution vias 143, respectively.

The frame 110 may further improve rigidity of the semiconductor package 100 depending on a specific material, and may serve to secure uniformity of thicknesses of an encapsulant 130. The frame 110 may have at least one through hole 110H. The through hole 110H may penetrate through the frame 110, and the semiconductor chip 120 may be disposed in the through hole 110H.

The semiconductor chip 120 may be disposed to be spaced apart from a wall surface of the through hole 110H by a predetermined distance, and may be surrounded by a wall surface of the through hole 110H. In addition, a distance in which one side surface of the semiconductor chip 120 is spaced apart from the wall surface of the through hole 110H may be different from a distance in which the other side surface of the semiconductor chip 120 is spaced apart from the wall surface of the through hole 110H. However, such a form is only an example and may be variously modified to have other forms, and another function may be performed depending on such a form.

The encapsulant 130 may encapsulate the semiconductor chip 120, while filling at least a portion of the through hole 110H. An encapsulation form thereof is not particularly limited, but may be a form in which at least the encapsulant 130 surrounds a portion of the semiconductor chip 120. For example, the encapsulant 130 may cover at least portions of the frame 110 and an inactive surface of the semiconductor chip 120, and may fill at least a portion of a space between a wall surface of the through hole 110H and a side surface of the semiconductor chip 120.

As set forth above, a semiconductor package capable of improving efficiency of a redistribution process of a connection pad of a semiconductor device, and reducing a lead time and production costs may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

The example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present inventive concept. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a semiconductor chip comprising a body having a first surface and a second surface, opposing the first surface, a connection pad disposed on the first surface of the body, and an extension pad disposed on the connection pad; and
   a connection structure comprising an insulating layer disposed on the first surface of the body of the semiconductor chip, a redistribution via penetrating through the insulating layer and having one side thereof in contact with the extension pad, and a redistribution layer disposed on the insulating layer and having a via pad in contact with the other side of the redistribution via,
   wherein a horizontal cross-sectional area of the extension pad of the semiconductor chip is greater than a horizontal cross-sectional area of the connection pad of the semiconductor chip, and
   wherein a first reference line parallel to a first edge of one side of the semiconductor chip and a second reference line parallel to a second edge of another side of the semiconductor chip, orthogonal to each other at a center of the semiconductor chip, has predetermined displacements, respectively, with respect to a third reference line parallel to a third edge of one side of the connection structure and a fourth reference line parallel to a fourth edge of another side of the connection structure, orthogonal to each other at a center of the connection structure.

2. The semiconductor package of claim 1, wherein the horizontal cross-sectional area of the extension pad of the semiconductor chip is greater than a horizontal cross-sectional area of the via pad of the redistribution layer.

3. The semiconductor package of claim 1, wherein a ratio of the horizontal cross-sectional area of the extension pad to the horizontal cross-sectional area of the connection pad is 2:1 to 6:1.

4. The semiconductor package of claim 1, wherein at least a portion of a surface of the redistribution via in contact with the extension pad is disposed to be outside of a region overlapping the connection pad.

5. The semiconductor package of claim 1, wherein a center axis of the semiconductor chip is disposed to be shifted from a center axis of the connection structure, and a center axis of the extension pad is disposed to be shifted from a center axis of the redistribution via.

6. The semiconductor package of claim 5, wherein an interval between the center axis of the semiconductor chip and the center axis of the connection structure is equal to an interval between the center axis of the extension pad and the center axis of the redistribution via.

7. The semiconductor package of claim 1, wherein a center axis of the semiconductor chip is disposed on the same line as a center axis of the connection structure, and a center axis of the extension pad is disposed to be shifted from a center axis of the redistribution via.

8. The semiconductor package of claim 1, wherein the semiconductor chip further comprises a passivation film disposed on the first surface of the body and having an opening exposing at least a portion of the connection pad,
   wherein at least a portion of the passivation film is disposed between the connection pad and the extension pad, wherein the extension pad has a connection portion filling the opening of the passivation film and an extension portion formed on the passivation film and in contact with the redistribution via, wherein a horizontal cross-sectional area of the extension portion of the extension pad is greater than a horizontal cross-sectional area of the connection portion of the extension pad.

9. The semiconductor package of claim 8, wherein a ratio of the horizontal cross-sectional area of the extension portion of the extension pad to the horizontal cross-sectional area of the connection portion of the extension pad is 2:1 to 6:1.

10. The semiconductor package of claim 8, wherein at least a portion of a surface of the redistribution via in contact with the extension portion of the extension pad is disposed to be outside of a region overlapping the connection portion on a plane.

11. The semiconductor package of claim 1, further comprising a frame having a through hole enclosing the semiconductor chip, wherein a center axis of the semiconductor chip is shifted from a center axis of the through hole and a center axis of the connection structure.

12. The semiconductor package of claim 1, wherein the insulating layer comprises a photosensitive insulating material comprising a photoimagable dielectric (PID) resin.

13. A semiconductor package comprising:

a semiconductor chip comprising a body having a first surface and a second surface, opposing the first surface, a connection pad disposed on the first surface of the body, and an extension pad disposed on the connection pad; and a connection structure disposed on the first surface of the body of the semiconductor chip and comprising a redistribution layer electrically connected to the extension pad, wherein the semiconductor chip is located in a horizontal cross-sectional region of the connection structure, and wherein a first reference line parallel to a first edge of one side of the semiconductor chip and a second reference line parallel to a second edge of another side of the semiconductor chip, orthogonal to each other at a center of the semiconductor chip, has predetermined displacements, respectively, with respect to a third reference line parallel to a third edge of one side of the connection structure and a fourth reference line parallel to a fourth edge of another side of the connection structure, orthogonal to each other at a center of the connection structure.

14. The semiconductor package of claim 13, wherein the center of the semiconductor chip is disposed to overlap with the center of the connection structure, wherein the first and third reference lines form an acute angle with each other, wherein the second and fourth reference lines form an acute angle with each other.

15. The semiconductor package of claim 13, wherein the center of the semiconductor chip is disposed to be offset from the center of the connection structure, wherein the first and third reference lines are spaced apart from each other by a predetermined interval and are parallel to each other, wherein the second and fourth reference lines are spaced apart from each other by a predetermined interval and are parallel to each other.

16. The semiconductor package of claim 13, wherein the center of the semiconductor chip is disposed to be offset from the center of the connection structure, wherein the first and third reference lines form an acute angle with each other, wherein the second and fourth reference lines form an acute angle with each other.

17. The semiconductor package of claim 13, further comprising an underbump layer disposed below the redistribution layer to be connected thereto, wherein at least a portion of the underbump layer is disposed in a fan-out region which is outside a region below the semiconductor chip.

18. A semiconductor package comprising:

a semiconductor chip on which a connection pad is mounted;

an extension pad disposed on the connection pad; and a connection structure comprising an insulating layer disposed on the extension pad, a redistribution via penetrating through the insulating layer and having one side thereof in contact with the extension pad, and a redistribution layer disposed on the insulating layer, wherein at least a portion of a surface of the redistribution via in contact with the extension pad is disposed to be outside of a region overlapping the connection pad, and wherein a first reference line parallel to a first edge of one side of the semiconductor chip and a second reference line parallel to a second edge of another side of the semiconductor chip, orthogonal to each other at a center of the semiconductor chip, has predetermined displacements, respectively, with respect to a third reference line parallel to a third edge of one side of the connection structure and a fourth reference line parallel to a fourth edge of another side of the connection structure, orthogonal to each other at a center of the connection structure.

19. The semiconductor package of claim 18, wherein a horizontal cross-sectional area of the extension pad is greater than a horizontal cross-sectional area of the connection pad of the semiconductor chip.

* * * * *